(12) United States Patent
van Cleemput et al.

(10) Patent No.: US 11,637,037 B2
(45) Date of Patent: *Apr. 25, 2023

(54) METHOD TO CREATE AIR GAPS

(71) Applicant: Lam Research Corporation, Fremont, CA (US)

(72) Inventors: Patrick van Cleemput, West Linn, OR (US); Seshasayee Varadarajan, Lake Oswego, OR (US); Bart J. van Schravendijk, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/825,473

(22) Filed: Mar. 20, 2020

(65) Prior Publication Data
US 2020/0219758 A1 Jul. 9, 2020

Related U.S. Application Data

(63) Continuation of application No. 15/893,458, filed on Feb. 9, 2018, now Pat. No. 11,088,019.
(Continued)

(51) Int. Cl.
*H01L 21/768* (2006.01)
*H01L 29/417* (2006.01)
(Continued)

(52) U.S. Cl.
CPC ...... *H01L 21/7682* (2013.01); *H01L 21/0228* (2013.01); *H01L 21/02175* (2013.01);
(Continued)

(58) Field of Classification Search
CPC ............... H01L 21/7682; H01L 21/768; H01L 21/67259; H01L 21/02175;
(Continued)

(56) References Cited

U.S. PATENT DOCUMENTS 4,544,444 A * 10/1985 Chang .................. C04B 41/009
204/192.37
4,708,766 A 11/1987 Hynecek
(Continued)

FOREIGN PATENT DOCUMENTS

CN 104752199 A 7/2015
JP S62136579 A 6/1987
(Continued)

OTHER PUBLICATIONS

Japanese Journal of Applied Physics, vol. 27, No. 9, Sep. 1988, T. Minami et al.: "Reactive ion etching of transparent conducting tin oxide films using electron cyclotron resonance hydrogen plasma", pp. L1753-L1756 (Year: 1988).*
(Continued)

*Primary Examiner* — Jeffrie R Lund
(74) *Attorney, Agent, or Firm* — Weaver Austin Villeneuve & Sampson LLP

(57) ABSTRACT

Tin oxide films are used to create air gaps during semiconductor substrate processing. Tin oxide films, disposed between exposed layers of other materials, such as $SiO_2$ and SiN can be selectively etched using a plasma formed in an $H_2$-containing process gas. The etching creates a recessed feature in place of the tin oxide between the surrounding materials. A third material, such as $SiO_2$ is deposited over the resulting recessed feature without fully filling the recessed feature, forming an air gap. A method for selectively etching tin oxide in a presence of $SiO_2$, SiC, SiN, SiOC, SiNO, SiCNO, or SiCN, includes, in some embodiments, contacting the substrate with a plasma formed in a process gas comprising at least about 50% $H_2$. Etching of tin oxide can be performed without using an external bias at the substrate and is preferably performed at a temperature of less than about 100° C.

16 Claims, 18 Drawing Sheets

Related U.S. Application Data

(60) Provisional application No. 62/458,464, filed on Feb. 13, 2017.

(51) Int. Cl.
| | |
|---|---|
| *H01L 29/66* | (2006.01) |
| *H01L 21/67* | (2006.01) |
| *H01L 21/311* | (2006.01) |
| *H01L 21/02* | (2006.01) |
| *H01L 29/78* | (2006.01) |

(52) U.S. Cl.
CPC .. *H01L 21/02274* (2013.01); *H01L 21/31122* (2013.01); *H01L 21/67069* (2013.01); *H01L 21/67259* (2013.01); *H01L 21/768* (2013.01); *H01L 21/76897* (2013.01); *H01L 29/41775* (2013.01); *H01L 29/6653* (2013.01); *H01L 29/6656* (2013.01); *H01L 29/66545* (2013.01); *H01L 29/66795* (2013.01); *H01L 29/785* (2013.01); *H01L 29/41791* (2013.01)

(58) Field of Classification Search
CPC ........... H01L 21/02274; H01L 21/0228; H01L 29/785; H01L 29/41775; H01L 29/6653; H01L 21/76897; H01L 29/66795; H01L 21/67069; H01L 29/66545; H01L 29/6656; H01L 21/31122; H01L 29/41791; H01L 21/764; H01L 21/3065; H01L 21/0274; H01L 21/324
See application file for complete search history.

(56) References Cited

U.S. PATENT DOCUMENTS

| | | |
|---|---|---|
| 4,778,562 A | 10/1988 | Chang |
| 4,878,993 A | 11/1989 | Rossi et al. |
| 5,032,221 A | 7/1991 | Roselle et al. |
| 5,079,178 A | 1/1992 | Chouan et al. |
| 5,171,401 A | 12/1992 | Roselle |
| 5,286,337 A | 2/1994 | Tsou |
| 5,318,664 A | 6/1994 | Saia et al. |
| 5,607,602 A | 3/1997 | Su et al. |
| 5,667,631 A | 9/1997 | Holland et al. |
| 5,723,366 A | 3/1998 | Suzuki et al. |
| 6,036,876 A | 3/2000 | Chen et al. |
| 6,180,438 B1 | 1/2001 | Deane et al. |
| 6,368,978 B1 | 4/2002 | Kumar et al. |
| 6,416,822 B1 | 7/2002 | Chiang et al. |
| 6,428,859 B1 | 8/2002 | Chiang et al. |
| 7,459,732 B2 | 12/2008 | Fleischer et al. |
| 8,163,094 B1 | 4/2012 | Greer et al. |
| 8,435,608 B1 | 5/2013 | Subramonium et al. |
| 8,747,964 B2 | 6/2014 | Park et al. |
| 8,969,110 B2 | 3/2015 | Choi |
| 9,269,590 B2 | 2/2016 | Luere et al. |
| 9,287,113 B2 | 3/2016 | Kang et al. |
| 9,390,909 B2 | 7/2016 | Pasquale et al. |
| 9,437,443 B2 | 9/2016 | Brink et al. |
| 9,515,156 B2 | 12/2016 | Besser et al. |
| 9,523,148 B1 | 12/2016 | Pore et al. |
| 9,824,893 B1 | 11/2017 | Smith et al. |
| 9,892,917 B2 | 2/2018 | Swaminathan et al. |
| 10,546,748 B2 | 1/2020 | Yu et al. |
| 10,665,501 B2 | 5/2020 | Rainville et al. |
| 11,031,245 B2 | 6/2021 | Smith et al. |
| 11,088,019 B2 | 8/2021 | van Cleemput et al. |
| 11,183,383 B2 | 11/2021 | Smith et al. |
| 11,322,351 B2 | 5/2022 | Yu et al. |
| 11,355,353 B2 | 6/2022 | Yu et al. |
| 11,551,938 B2 | 1/2023 | Heo et al. |
| 2001/0008227 A1 | 7/2001 | Sadamoto et al. |
| 2001/0018252 A1 | 8/2001 | Park et al. |
| 2001/0030860 A1 | 10/2001 | Kimura et al. |
| 2002/0044230 A1 | 4/2002 | Yamazaki et al. |
| 2002/0113271 A1 | 8/2002 | Noguchi et al. |
| 2002/0134425 A1 | 9/2002 | Yamamoto et al. |
| 2002/0185466 A1 | 12/2002 | Furuta et al. |
| 2004/0033698 A1 | 2/2004 | Lee et al. |
| 2006/0072084 A1 | 4/2006 | Van Herpen et al. |
| 2006/0073706 A1 | 4/2006 | Li et al. |
| 2006/0148118 A1 | 7/2006 | Hsiung et al. |
| 2006/0175558 A1 | 8/2006 | Bakker et al. |
| 2006/0270209 A1 | 11/2006 | Mitsui et al. |
| 2007/0040999 A1 | 2/2007 | Wilhelmus Van Herpen et al. |
| 2007/0069160 A1 | 3/2007 | Banine et al. |
| 2008/0061030 A1 | 3/2008 | Liu et al. |
| 2008/0210660 A1 | 9/2008 | Stockum et al. |
| 2009/0011589 A1 | 1/2009 | Jeon et al. |
| 2009/0017616 A1 | 1/2009 | Grunow et al. |
| 2009/0145879 A1 | 6/2009 | Fairbairn et al. |
| 2009/0233425 A1 | 9/2009 | Furuno et al. |
| 2010/0099046 A1 | 4/2010 | Kim et al. |
| 2010/0120247 A1 | 5/2010 | Park |
| 2010/0159639 A1 | 6/2010 | Sakata |
| 2010/0195033 A1 | 8/2010 | Takayama et al. |
| 2011/0121378 A1 | 5/2011 | Ahn et al. |
| 2011/0198627 A1 | 8/2011 | Maindron et al. |
| 2011/0306214 A1 | 12/2011 | Zin |
| 2012/0193632 A1 | 8/2012 | Toriumi |
| 2013/0161625 A1 | 6/2013 | Ku et al. |
| 2013/0309871 A1 | 11/2013 | DeVilliers |
| 2014/0060574 A1 | 3/2014 | Wyse et al. |
| 2014/0167040 A1 | 6/2014 | Lee et al. |
| 2014/0308812 A1 | 10/2014 | Arghavani et al. |
| 2014/0367833 A1 | 12/2014 | Brink et al. |
| 2015/0000737 A1 | 1/2015 | Miyake et al. |
| 2015/0126042 A1 | 5/2015 | Pasquale et al. |
| 2015/0140726 A1 | 5/2015 | Honda et al. |
| 2015/0162416 A1 | 6/2015 | Chang et al. |
| 2015/0179414 A1 | 6/2015 | Xiao et al. |
| 2015/0221541 A1 | 8/2015 | Nemani et al. |
| 2015/0243661 A1 | 8/2015 | Matsumoto |
| 2015/0247238 A1 | 9/2015 | Pasquale et al. |
| 2015/0287612 A1 | 10/2015 | Luere et al. |
| 2015/0318181 A1 | 11/2015 | Cantone et al. |
| 2016/0111374 A1 | 4/2016 | Brink et al. |
| 2016/0111515 A1 | 4/2016 | Besser et al. |
| 2016/0195812 A1 | 7/2016 | Huang et al. |
| 2016/0203982 A1 | 7/2016 | Lin et al. |
| 2016/0293405 A1 | 10/2016 | Matsumoto et al. |
| 2016/0293437 A1 | 10/2016 | Zhou et al. |
| 2016/0293438 A1 | 10/2016 | Zhou et al. |
| 2016/0314985 A1 | 10/2016 | Yang et al. |
| 2016/0329207 A1 | 11/2016 | Mohanty et al. |
| 2016/0336178 A1 | 11/2016 | Swaminathan et al. |
| 2016/0379842 A1* | 12/2016 | Kal ................... H01L 21/67248 |
| | | 438/710 |
| 2017/0301552 A1 | 10/2017 | de Villiers |
| 2018/0012759 A1 | 1/2018 | Smith et al. |
| 2018/0240667 A1 | 2/2018 | Yu et al. |
| 2018/0233398 A1 | 8/2018 | van Cleemput et al. |
| 2018/0277661 A1 | 9/2018 | Nagayama et al. |
| 2019/0157084 A1 | 5/2019 | Huang et al. |
| 2019/0237341 A1 | 8/2019 | Yu et al. |
| 2019/0312147 A1 | 10/2019 | Lee et al. |
| 2019/0390341 A1 | 12/2019 | Singhal et al. |
| 2020/0006082 A1 | 1/2020 | Su |
| 2020/0051807 A1 | 2/2020 | Singhal et al. |
| 2020/0083044 A1 | 3/2020 | Yu et al. |
| 2020/0219725 A1 | 7/2020 | Smith et al. |
| 2020/0219758 A1* | 7/2020 | van Cleemput .. H01L 21/02274 |
| 2021/0017643 A1 | 1/2021 | Kanakasabapathy et al. |
| 2021/0242019 A1 | 8/2021 | Smith et al. |
| 2021/0265163 A1 | 8/2021 | Yu et al. |
| 2021/0265173 A1 | 8/2021 | Yu et al. |
| 2021/0343579 A1* | 11/2021 | van Cleemput ...... H01L 29/785 |
| 2022/0005694 A1* | 1/2022 | Smith ................ C23C 16/45542 |
| 2022/0165571 A1 | 5/2022 | Yu et al. |

(56) References Cited

U.S. PATENT DOCUMENTS

| | | | |
|---|---|---|---|
| 2022/0208551 A1 | 6/2022 | Heo et al. | |
| 2022/0270877 A1 | 8/2022 | Yu et al. | |

FOREIGN PATENT DOCUMENTS

| | | | |
|---|---|---|---|
| JP | S6425420 A | 1/1989 | |
| JP | H01-259184 A | 10/1989 | |
| JP | H0377209 A | 4/1991 | |
| JP | H03136249 A | 6/1991 | |
| JP | H04506888 A | 11/1992 | |
| JP | H05-267701 A | 10/1993 | |
| JP | H09-120967 A | 5/1997 | |
| JP | 2644758 B2 | 8/1997 | |
| JP | 2007-208076 A | 8/2007 | |
| JP | 62179774 A | 8/2007 | |
| JP | 2013179127 A | 9/2013 | |
| JP | 2015-111668 A | 6/2015 | |
| JP | 2015-122497 A | 7/2015 | |
| KR | 1995-0012151 A | 5/1995 | |
| KR | 19990023468 A | 3/1999 | |
| KR | 20030007457 A | 1/2003 | |
| KR | 2004-0016779 A | 2/2004 | |
| KR | 20070076721 A | 7/2007 | |
| KR | 20090022667 A | 3/2009 | |
| KR | 20120125102 A | 11/2012 | |
| KR | 2015-0053253 A | 5/2015 | |
| KR | 10-2017-0141673 A | 12/2017 | |
| KR | 20180002026 A | 1/2018 | |
| TW | 134077 | 5/1990 | |
| TW | 538137 B | 6/2003 | |
| TW | 200531080 A | 9/2005 | |
| TW | 2009038660 A | 9/2009 | |
| TW | 201027593 A | 7/2010 | |
| TW | 201410914 A | 3/2014 | |
| TW | 201427084 A | 7/2014 | |
| TW | 201546314 A | 12/2015 | |

OTHER PUBLICATIONS

U.S. Office Action, dated Feb. 9, 2017, issued in U.S. Appl. No. 15/195,348.
U.S. Notice of Allowance, dated Jun. 26, 2017, issued in U.S. Appl. No. 15/195,348.
U.S. Office Action, dated Dec. 26, 2019, issued in U.S. Appl. No. 15/713,377.
U.S. Final Office Action, dated Apr. 16, 2020, issued in U.S. Appl. No. 15/713,377.
U.S. Office Action, dated Sep. 13, 2019, issued in U.S. Appl. No. 15/893,458.
U.S. Final Office Action, dated Mar. 19, 2020, issued in U.S. Appl. No. 15/893,458.
U.S. Office Action, dated Apr. 11, 2019, issued in U.S. Appl. No. 15/894,635.
U.S. Notice of Allowance, dated Aug. 21, 2019, issued in U.S. Appl. No. 15/894,635.
Chinese First Office Action dated Jan. 6, 2020 issued in Application No. CN 201710498301.5.
International Search Report and Written Opinion dated Jun. 27, 2018 issued in Application No. PCT/US18/18019.
International Preliminary Report on Patentability dated Aug. 29, 2019 issued in Application No. PCT/US2018/018019.
International Search Report and Written Opinion dated May 17, 2019 issued in Application No. PCT/US2019/015559.
Choi, W.-S., (Dec. 25, 2009) "The Fabrication of Tin Oxide Films by Atomic Layer Deposition using Tetrakis(Ethylmethylamino) Tin Precursor," Transactions on Electrical and Electronic Materials, 10(6):200-202.
Du, X. et al., (Jul./Aug. 2005) "In situ examination of tin oxide atomic layer deposition using quartz crystal microbalance and Fourier transform infrared techniques," J. Vac. Sci. Technol, A, 23(4):581-588.
Elam, J.W., et al, (2008) "Atomic Layer Deposition of Indium Tin Oxide Thin Films Using Nonhalogenated Precursors," J. Phys. Chem. C, 112(6):1938-1945.
Elam, J.W., et al, (Mar./Apr. 2008) "Atomic layer deposition of tin oxide films using tetrakis(dimethylamino) tin," J. Vac. Sci. Technol. A, 26(2):244-252.
Heo, J., et al., (2010) "Low Temperature Atomic Layer Deposition of Tin Oxide," Chemistry of Materials, 22(17):4964-4973.
Heo, J., et al., (2012) "Atomic layer deposition of tin oxide with nitric oxide as an oxidant gas," J. Mater, Chem., 22:4599-4602.
Kwon, K.H., et al., (Mar./Apr. 2010) "Etch mechanism of In2O3 and SnO2 thin films in HBr-based inductively coupled plasmas," J. Vac. Sci. Technol. A 28(2):226-231.
Li, X., et al., (2012) "Tin Oxide with Controlled Morphology and Crystallinity by Atomic Layer Deposition onto Graphene Nanosheets for Enhanced Lithium Storage," Advanced Function Materials, 22:1647-1654.
Mohri et al., (Oct. 1990) "Plasma Etching of ITO Thin Films Using a CH4/H2 Gas Mixture," Japanese Journal of Applied Physics, 29(10):L1932-L1935.
Mullings, M.N., et al., (Nov./Dec. 2013) "Tin oxide atomic layer deposition from tetrakis(dimethylamino)tin and water," J. Vac. Sci. Technol. A, 31(6):061503-1-061503-8.
Wolf, S. and Tauber, R.N. (1986) "Silicon Processing for the VLSI Era," Process Technology,vol. 1, Lattice Press, pp. 545-547.
Wu, B.-R., et al., (2014) "Texture-Etched SnO2 Glasses Applied to Silicon Thin-Film Solar Cells," Journal of Nanomaterials, vol. 2014, Article ID 907610, 9 pages.
U.S. Appl. No. 16/825,514, filed Mar. 20, 2020, Smith et al.
RD 301101A, May 1989.
U.S. Office Action, dated Sep. 14, 2020, issued in U.S. Appl. No. 15/713,377.
U.S. Notice of Allowance dated Jan. 26, 2021 issued in U.S. Appl. No. 15/713,377.
U.S. Office Action, dated Aug. 3, 2020, issued in U.S. Appl. No. 15/893,458.
U.S. Final Office Action, dated Dec. 15, 2020, issued in U.S. Appl. No. 15/893,458.
U.S. Office Action Interview Summary, dated Mar. 11, 2021, issued in U.S. Appl. No. 15/893,458.
U.S. Notice of Allowance dated Apr. 2, 2021 issued in U.S. Appl. No. 15/893,458.
U.S. Office Action, dated Mar. 30, 2021, issued in U.S. Appl. No. 16/687,142.
U.S. Office Action, dated Jun. 25, 2020, issued in U.S. Appl. No. 16/260,764.
U.S. Final Office Action, dated Dec. 7, 2020 issued in U.S. Appl. No. 16/260,764.
Chinese Second Office Action dated Jun. 15, 2020 issued in Application No. CN 201710498301.5.
Taiwanese First Office Action dated Dec. 2, 2020 issued in Application No. TW 106121182.
International Search Report and Written Opinion (ISA/KR) dated Jul. 3, 2019 issued in Application No. PCT/US2019/022319.
International Preliminary Report and Patentability (ISA/KR) dated Oct. 1, 2020 issued in Application No. PCT/US2019/022319.
International Preliminary Report on Patentability dated Aug. 13, 2020 issued in Application No. PCT/US2019/015559.
Gordon, et al., (1992) "Low-Temperature Atmospheric Pressure Chemical Vapor Deposition of Polycrystalline Tin Nitride Thin Films" Chem. Mater. 1992, 4, pp. 68-71.
U.S. Appl. No. 17/302,847, filed May 13, 2021, Yu et al.
U.S. Appl. No. 17/302,044, filed Apr. 22, 2021, Smith et al.
U.S. Notice of Allowance dated Jun. 23, 2021 issued in U.S. Appl. No. 16/825,514.
Taiwanese Second Office Action dated Jul. 20, 2021 issued in Application No. TW 106121182.
Japanese First Office Action dated Aug. 3, 2021 issued in Application No. JP 2017-120945.
Korean First Office Action dated Aug. 18, 2021 issued in Application No. KR 10-2017-0077686.
Taiwanese First Office Action dated Jun. 17, 2021 issued in Application No. TW 107104861.

(56) References Cited

OTHER PUBLICATIONS

Korean First Office Action dated Jul. 30, 2021 issued in Application No. KR 10-2021-7017077.
Taiwanese First Office Action dated Aug. 27, 2021 issued in Application No. TW 110121421.
Co-pending U.S. Appl. No. 17/448,284, filed Sep. 21, 2021.
International Preliminary Report on Patentability dated Jan. 6, 2022 in PCT Application No. PCT/US2020/038996.
International Search Report and Written Opinion dated Oct. 5, 2020, in application No. PCT/US2020/038996.
KR Office Action dated Aug. 18, 2021, in application No. KR1020200034960.
Notice of Allowance dated Nov. 16, 2021, in U.S. Appl. No. 16/687,142.
Notice of Allowance dated Oct. 27, 2021, in U.S. Appl. No. 16/825,514.
TW Office Action dated Dec. 30, 2021, in application No. 110121421 with English translation.
TW Office Action dated Sep. 7, 2021, in TW Application No. TW107105182 with English translation.
TW Rejection Decision dated Oct. 21, 2021, in application No. TW107104861 with English translation.
U.S. Appl. No. 17/448,284, filed Sep. 21, 2021.
U.S. Corrected Notice of Allowability dated Dec. 1, 2021, in U.S. Appl. No. 16/687,142.
U.S. Office Action, dated Sep. 27, 2021 issued in U.S. Appl. No. 16/260,764.
JP Office Action dated Feb. 1, 2022, in Application No. JP2018-021500 with English translation.
U.S. Notice of Allowance dated Feb. 2, 2022 in U.S. Appl. No. 16/260,764.
Co-pending U.S. Appl. No. 17/596,921, filed Dec. 21, 2021.
JP Office Action dated Mar. 29, 2022, in Application No. JP2019-543306 with English translation.
JP Office Action dated May 10, 2022, in Application No. JP2017-120945 with English translation.
KR Office Action dated Jun. 8, 2022, in Application No. KR1020200034960 with English translation.
KR Office action dated Apr. 20, 2022, in Application No. KR10-2019-7026772 with English translation.
KR Office Action dated Feb. 17, 2022, in Application No. KR10-2021-7017077 with English translation.
KR Office Action dated Mar. 29, 2022, in Application No. KR1020170077686 with English translation.
KR Office Action dated Mar. 29, 2022, in Application No. KR1020200034960 with English translation.
TW Office Action dated Apr. 27, 2022, in Application No. TW107105182 with English translation.
U.S. Appl. No. 17/650,550, filed Feb. 10, 2022.
U.S. Corrected Notice of Allowance dated Feb. 16, 2022 in U.S. Appl. No. 16/260,764.
U.S. Corrected Notice of Allowance dated Feb. 22, 2022 in U.S. Appl. No. 16/687,142.
U.S. Corrected Notice of Allowance dated Mar. 17, 2022 in U.S. Appl. No. 16/687,142.
U.S. Corrected Notice of Allowance dated May 6, 2022 in U.S. Appl. No. 16/260,764.
U.S. Notice of Allowance dated Apr. 4, 2022, in U.S. Appl. No. 16/687,142.
U.S. Notice of Allowance dated May 11, 2022, in U.S. Appl. No. 17/596,921.
U.S. Restriction Requirement dated Mar. 17, 2022, in U.S. Appl. No. 17/302,044.
JP Office Action dated Nov. 1, 2022, in Application No. JP2019-543306 with English translation.
KR Office Action dated Aug. 30, 2022 in Application No. KR10-2020-7024840 With English translation.
KR Office Action dated Jul. 18, 2022 in Application No. KR10-2021-7017077 With English translation.
KR Office Action dated Nov. 20, 2022, in Application No. KR10-2020-0034961.
KR Office Action dated Nov. 20, 2022, in Application No. KR10-2018-0014921.
TW Office Action dated Nov. 17, 2022, in Application No. TW107104861 with English Translation.
TW Office Action dated Sep. 23, 2022 In Application No. TW111123354 with English translation.
U.S. Corrected Notice of Allowance dated Nov. 25, 2022 in U.S. Appl. No. 17/596,921.
U.S. Non Final Office Action dated Aug. 15, 2022 in U.S. Appl. No. 17/302,044.
U.S. Notice of Allowance dated Aug. 23, 2022 in U.S. Appl. No. 17/596,921.
U.S. Appl. No. 18/056,468, inventors Heo et al., filed Nov. 17, 2022.
International Preliminary Report on Patentability dated Dec. 29, 2022, in PCT Application No. PCT/US2021/036763.
JP Office Action dated Jan. 24, 2023 in Application No. JP2020-540611 with English translation.
KR Office action dated Jan. 30, 2023 in Application No. KR10-2019-7026772 with English translation.
U.S. Non-Final Office Action dated Feb. 13, 2023 in U.S. Appl. No. 17/302,847.
U.S. Appl. No. 18/001,590, Inventors Ha et al., filed Dec. 12, 2022.
KR Office Action dated Nov. 20, 2022, in Application No. KR10-2018-0014921 with English translation.
KR Office Action dated Nov. 20, 2022, in Application No. KR10-2020-0034961 with English translation.
International Preliminary Report on Patentability dated Feb. 2, 2023, in PCT Application No. PCT/US2021/042626.
U.S. Appl. No. 18/002,627, inventors Singhal et al., field Dec. 20, 2022.

* cited by examiner

METHOD TO CREATE AIR GAPS

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

FIELD OF THE INVENTION

This invention pertains to methods of semiconductor device manufacturing. Specifically, embodiments of this invention pertain to methods of creating air gaps during semiconductor substrate processing.

BACKGROUND

In semiconductor device fabrication, deposition and etching techniques are used for forming patterns of materials on a substrate. Patterning often requires etching one material in a presence of another material with high etch selectivity. The etch selectivity requirements become more stringent as the sizes of patterned features on the substrate become smaller. Further, wet etching methods, such as etching of $SiO_2$ with HF become less desirable on substrates having high aspect ratio recessed features, due to problems in the penetration of the etchant into the recessed features.

Highly selective etching methods are needed for patterning in a variety of applications, including formation of dynamic random-access memory (DRAM), patterning in the fabrication of fin field effect transistors (FinFETs), and in back end of line (BEOL) processing.

SUMMARY

Materials that can be selectively etched with high etch selectivity in a presence of commonly used dielectrics, such as $SiO_2$ and SiN, and associated etching methods are particularly desired. $SnO_2$ is provided herein as a material that can be selectively etched relative to $SiO_2$, SiN, and a variety of other materials using a highly selective dry etch chemistry. Methods for forming air gaps in semiconductor device fabrication (e.g., during FinFET fabrication) that employ $SnO_2$ as a sacrificial spacer material are also provided.

According to one aspect, a method of processing a semiconductor substrate is provided. The method includes: providing a semiconductor substrate having an exposed $SnO_2$ layer (e.g., a $SnO_2$ layer deposited by atomic layer deposition); and etching the $SnO_2$ layer at a temperature of less than about 100° C., wherein the etching comprises exposing the semiconductor substrate to a plasma formed in a process gas comprising at least about 50% $H_2$ by volume. In some embodiments, the provided semiconductor substrate further includes a second material selected from the group consisting of $SiO_2$, SiC, SiN, SiOC, SiNO, SiCNO, and SiCN, and hydrogen plasma etching of $SnO_2$ is performed with an etch selectivity of at least about 10, such as at least about 80, relative to the second material. The second material may be exposed on the substrate before the start of the $SnO_2$ etch, or, in some embodiments, the second material may be exposed during the course of the $SnO_2$ etching. In some embodiments, the second material is $SiO_2$, and the etch removes $SnO_2$ with an etch selectivity of at least about 10 relative to $SiO_2$.

The composition of the process gas in the $SnO_2$ etch can vary, and may include other gases in addition to $H_2$. However, in some embodiments the process gas consists essentially of $H_2$ (e.g., is 100% $H_2$). In some embodiments, the process gas includes at least about 50% $H_2$ and further includes an inert gas, such as helium. In some embodiments the process gas may consist essentially of $H_2$ and an inert gas. In some implementations, the concentration of $H_2$ in the process gas is at least about 80%. Optionally, the process gas may further include a hydrocarbon and/or $Cl_2$. In one example the process gas includes $H_2$ (50% or more), helium, and a hydrocarbon. The plasma in the process gas can be formed using high frequency and/or low frequency plasma generation. Notably, the use of external bias at the substrate is optional. In some embodiments, etching is conducted without providing an external bias to the substrate. In some embodiments plasma is generated using a power density of between about 0.0018 and 0.36 W/cm$^2$. The pressure in the process chamber during etching is, in some embodiments, between about 1 and 175 mTorr.

In another aspect, an apparatus for etching a $SnO_2$ layer is provided. The apparatus includes a process chamber having a substrate holder configured for holding the semiconductor substrate during etching; a plasma generator configured for generating a plasma in a process gas; and a controller. The controller includes program instructions for implementing any of the methods describing herein. In one embodiment, the controller includes program instructions for causing the etching of the $SnO_2$ layer on the semiconductor substrate at a temperature of less than about 100° C., wherein causing the etching comprises causing an exposure of the semiconductor substrate to a plasma formed in a process gas comprising at least about 50% $H_2$.

In another aspect a non-transitory computer machine-readable medium is provided, where it includes program instructions for controlling an etching apparatus. The program instructions include code for causing the etching of the $SnO_2$ layer on the semiconductor substrate at a temperature of less than about 100° C., wherein causing the etching comprises causing an exposure of the semiconductor substrate to a plasma formed in a process gas comprising at least about 50% $H_2$.

In another aspect a method for creating an air gap on a semiconductor substrate is provided. The method includes: (a) providing a semiconductor substrate having an exposed layer of a first material, an exposed layer of a second material, and an exposed layer of $SnO_2$ positioned between the layer of the first material and the layer of the second material; (b) selectively etching the exposed $SnO_2$ relative to both the first and the second materials using a hydrogen plasma etch chemistry, and thereby forming a recessed feature between the first and second materials; and (c) depositing a third material over the recessed feature without fully filling the recessed feature, and thereby forming the air gap between the layer of the first material and the layer of the second material. In some implementations the first material is selected from the group consisting of $SiO_2$, SiC, SiN, SiOC, SiNO, SiCNO, and SiCN, and the second material is selected from the group consisting of $SiO_2$, SiC, SiN, SiOC, SiNO, SiCNO, and SiCN. In some embodiments the first and second materials are the same material. In other embodiments, the first and second materials are different materials. The third material, in some embodiments is $SiO_2$.

In some implementations the hydrogen plasma etch of the $SnO_2$ layer includes exposing the semiconductor substrate to a plasma formed in a process gas comprising at least about 50% $H_2$. In some embodiments the etching is conducted at a temperature of less than about 100° C. The described methods are particularly useful for forming air gaps in narrow recessed features. In one implementation, the width of the $SnO_2$ layer is between about 20-100 Å.

In one embodiment the substrate having an $SnO_2$ layer residing between the layers of the first and second materials is formed using the following sequence of steps. The process starts by forming a gate (a protruding feature made e.g., from a high-k oxide, such as hafnium oxide) on the semiconductor substrate; conformally forming a layer of the first material (e.g., SiN) over the semiconductor substrate, such that the first material covers both sidewalls and a top surface of the gate; conformally forming an $SnO_2$ layer over the layer of the first material such that $SnO_2$ covers the first material both on the sidewalls and on the top surface of the gate (e.g., to a thickness of between about 20-100 Å); and conformally forming a layer of the second material (e.g., $SiO_2$) over the $SnO_2$ layer, such that the second material covers the $SnO_2$ both on the sidewalls and on the top surface of the gate. The process then follows by removing the second material from the horizontal surfaces of the substrate and thereby forming a structure having an exposed $SnO_2$ layer between the exposed layers of the first and second materials.

In another aspect, a system for forming an air gap on a semiconductor substrate is provided. The system includes one or more deposition chambers; one or more etch chambers; and a controller. The controller includes program instructions for implementing any air gap formation methods described herein. For example, the controller may include instructions for causing the steps of (i) on a semiconductor substrate having an exposed layer of a first material, an exposed layer of a second material, and an exposed layer of $SnO_2$ positioned between the layer of the first material and the layer of the second material, selectively etching the exposed $SnO_2$ relative to both the first and the second materials using a hydrogen plasma etch chemistry, and thereby forming a recessed feature between the first and second materials; and (ii) depositing a third material over the recessed feature without fully filling the recessed feature, and thereby forming the air gap between the layer of the first material and the layer of the second material.

In another aspect, the system includes any of the apparatuses and systems described herein and a stepper.

In another aspect a non-transitory computer machine-readable medium is provided, where it includes program instructions for controlling a system, where the program instructions include code for: (i) on a semiconductor substrate having an exposed layer of a first material, an exposed layer of a second material, and an exposed layer of $SnO_2$ positioned between the layer of the first material and the layer of the second material, selectively etching the exposed $SnO_2$ relative to both the first and the second materials using a hydrogen plasma etch chemistry, and thereby forming a recessed feature between the first and second materials; and (ii) depositing a third material over the recessed feature without fully filling the recessed feature, and thereby forming the air gap between the layer of the first material and the layer of the second material.

In another aspect, a method for processing a semiconductor substrate, where the method involves deposition of an $SnO_2$ dummy gate is provided. The method includes: (a) forming an $SnO_2$ dummy gate on the semiconductor substrate; (b) processing the semiconductor substrate in a presence of the $SnO_2$ dummy gate; (c) etching the $SnO_2$ dummy gate with a plasma formed in a process gas comprising $H_2$ to form a recessed feature in place of the dummy gate; and (d) depositing a high-k dielectric material into the formed recessed feature to thereby form a gate in place of the dummy gate. In another aspect, a system for processing the semiconductor substrate is provided where the system includes one or more deposition process chambers, one or more etch process chambers and a controller comprising program instructions for causing the steps of: (i) forming an $SnO_2$ dummy gate on the semiconductor substrate; (ii) processing the semiconductor substrate in a presence of the $SnO_2$ dummy gate; (iii) etching the $SnO_2$ dummy gate with a plasma formed in a process gas comprising $H_2$ to form a recessed feature in place of the dummy gate; and (iv) depositing a high-k dielectric material into the formed recessed feature to thereby form a gate in place of the dummy gate. In another aspect, a non-transitory computer readable medium comprising program instructions for controlling a system, is provided, where the program instructions include code for causing the steps of: (i) forming an $SnO_2$ dummy gate on the semiconductor substrate; (ii) processing the semiconductor substrate in a presence of the $SnO_2$ dummy gate; (iii) etching the $SnO_2$ dummy gate with a plasma formed in a process gas comprising $H_2$ to form a recessed feature in place of the dummy gate; and (iv) depositing a high-k dielectric material into the formed recessed feature to thereby form a gate in place of the dummy gate.

In some embodiments, provided methods are integrated with photolithographic patterning sequences and further include: applying photoresist to the semiconductor substrate; exposing the photoresist to light; patterning the photoresist and transferring the pattern to the substrate; and selectively removing the photoresist from the substrate.

These and other aspects of implementations of the subject matter described in this specification are set forth in the accompanying drawings and the description below.

DETAILED DESCRIPTION OF THE PREFERRED EMBODIMENTS

Figure 1:
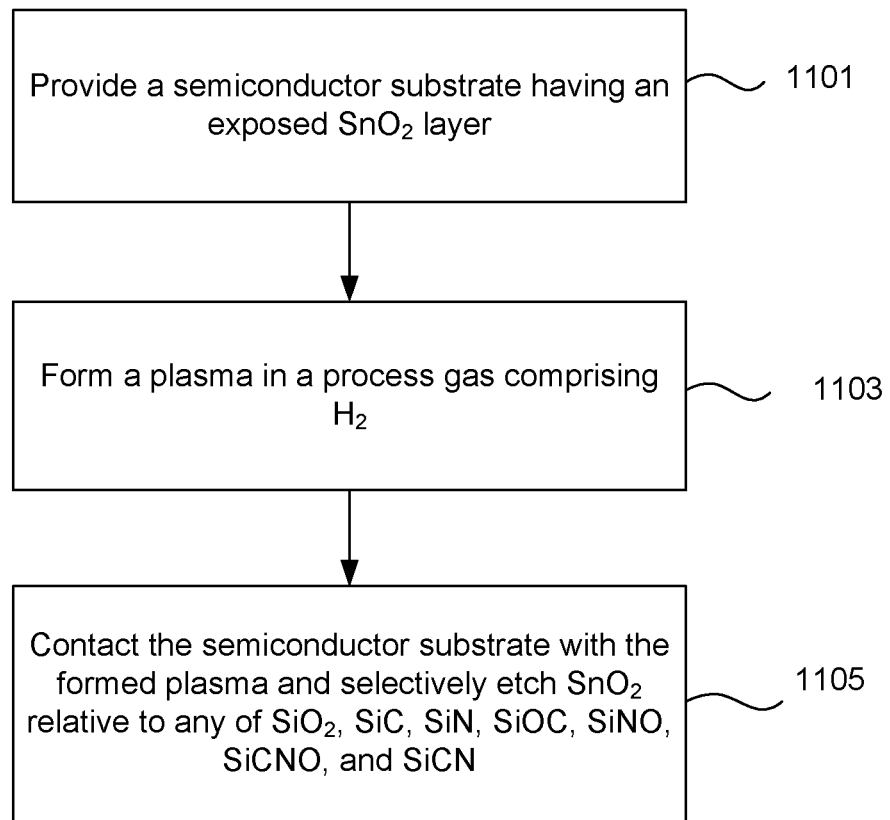
FIG. 1 is a process flow diagram for a processing method according to an embodiment provided herein.

Methods for etching tin (IV) oxide ($SnO_2$) in semiconductor device manufacturing are provided. In some embodiments, provided methods are used to etch tin oxide with high selectivity versus one or more of $SiO_2$, SiC, SiN, SiOC, SiNO, SiCNO, and SiCN. The etch selectivity in some embodiments is greater than 10, such as greater than 30, e.g., greater than 50, or greater than 80. The etch selectivity refers to the ratio of the etch rate of $SnO_2$ to the etch rate of the other material for selected process conditions. In some examples, etch selectivity of 100 was achieved for etching $SnO_2$ relative to $SiO_2$. These etch selectivities are achieved for an etching method that involves contacting the semiconductor substrate with a plasma formed in a process gas comprising $H_2$. The provided methods involve converting solid $SnO_2$ to gaseous $SnH_4$ via exposure of $SnO_2$ to hydrogen plasma. The gaseous $SnH_4$ product can then be easily removed from the process chamber by purging and/or evacuation. The other material (e.g., $SiO_2$, SiC, SiN, SiOC, SiNO, SiCNO, or SiCN) in some embodiments is exposed on the semiconductor substrate at the beginning of $SnO_2$ etching. In other embodiments the other material is not exposed at the beginning of $SnO_2$ etching but becomes exposed during the course of etching.

$SnO_2$ can be deposited, for example, by ALD or PECVD and may include small amounts of other materials, such as carbon and hydrogen (typically less than 10 atomic %). It is also understood that small deviations from 1:2 tin to oxygen stoichiometry are possible in tin oxide and are within the scope of $SnO_2$ structure. For example, O to Sn atomic ratio is between about 2.0-2.3 in some examples of $SnO_2$. Tin oxides with O to Sn ratio of between about 1.5-2.5 are within the scope of $SnO_2$ material, as used herein.

$SiO_2$, SiC, SiN, SiOC, SiNO, SiCNO, and SiCN materials may be doped or undoped, and may optionally include hydrogen. The dopant, when present, typically does not exceed a concentration of 10% atomic (excluding hydrogen). These materials can be deposited using a variety of methods, such as CVD, PECVD and ALD. A variety of silicon-containing precursors can be used for deposition of these materials, including silane, tetraalkylsilanes, trialkylsilanes, TEOS, etc. For example, $SiO_2$ may be deposited using TEOS or silane as the silicon-containing precursor.

The term "semiconductor substrate" as used herein refers to a substrate at any stage of semiconductor device fabrication containing a semiconductor material anywhere within its structure. It is understood that the semiconductor material in the semiconductor substrate does not need to be exposed. Semiconductor wafers having a plurality of layers of other materials (e.g., dielectrics) covering the semiconductor material, are examples of semiconductor substrates.

Provided methods can be used for etching $SnO_2$ layers of a variety of widths and aspect ratios. These methods are particularly advantageous for etching narrow layers (e.g., $SnO_2$ layers with widths of 20-100 Å, e.g., 25-75 Å), and for creating relatively high aspect ratio recessed features, such as for etching $SnO_2$ to create recessed features with aspect ratios of at least about 5:1 (e.g. with aspect ratios of between about 10:1 to 100:1). While provided methods are not limited to these applications, etching of narrow layers and/or formation of high aspect ratio recessed features using hydrogen plasma etching methods provided herein, is particularly useful, because conventional methods and materials (e.g., wet HF etching of SiN spacers) are not well adapted for these applications.

An etching method according to an embodiment provided herein is illustrated in a process flow diagram shown in FIG. 1. In operation 1101, a semiconductor substrate having an exposed $SnO_2$ layer is provided. The substrate is placed into a process chamber of an etching apparatus, where the apparatus is configured for generating a plasma in a process gas. Next, in operation 1103, plasma is generated in a process gas comprising $H_2$. In operation 1105, the substrate is contacted with the formed hydrogen plasma and the $SnO_2$ layer is etched selectively relative to any of $SiO_2$, SiC, SiN, SiOC, SiNO, SiCNO, and SiCN materials on the substrate. Selective etching involves etching $SnO_2$ with an etch selectivity of greater than 1, more preferably greater than 10, such as greater than 50, relative to any the listed materials.

In some embodiments, the semiconductor substrate provided in operation 1101, in addition to an exposed $SnO_2$ layer, further includes an exposed layer of a second material, where the second material includes one or more of $SiO_2$, SiC, SiN, SiOC, SiNO, SiCNO, and SiCN. In other embodiments the second material is not exposed at the beginning of $SnO_2$ etching, but becomes exposed after $SnO_2$ has been etched for some time.

The substrate provided in 1101 is obtained after depositing, and optionally patterning, $SnO_2$ layer and a layer of the second material (e.g., any combination of $SiO_2$, SiC, SiN, SiOC, SiNO, SiCNO, and SiCN). The $SnO_2$ layer is deposited by any suitable method such as by CVD (including PECVD), ALD (including PEALD), sputtering, etc. In some embodiments it is preferable to deposit the $SnO_2$ film conformally, such that it follows the surface of the substrate, including the surfaces of any protrusions and recessed features on the substrate. In some embodiments the $SnO_2$ layer is deposited conformally to a thickness of between about 20-100 Å. One of the suitable deposition methods of conformal $SnO_2$ film is ALD. Thermal or plasma enhanced ALD can be used. In a typical thermal ALD method, the substrate is provided to an ALD process chamber and is sequentially exposed to a tin-containing precursor, and an oxygen-containing reactant, where the tin-containing precursor and the oxygen containing reactant are allowed to react on the surface of the substrate to form $SnO_2$. The ALD process chamber is typically purged with an inert gas after the substrate is exposed to the tin-containing precursor, and before the oxygen-containing reactant is admitted to the process chamber to prevent reaction in the bulk of the process chamber. Further, the ALD process chamber is typically purged with an inert gas after the substrate has been treated with the oxygen-containing reactant. The sequential exposure is repeated for several cycles, e.g., between about 10-100 cycles can be performed until the SnO layer having desired thickness is deposited. Examples of suitable tin-containing precursors include halogenated tin-containing precursors (such as $SnCl_4$, and $SnBr_4$), and non-halogenated tin-containing precursors, such as organotin compounds, which include alkyl substituted tin amides and the like. Specific examples of alkyl substituted tin amides that are suitable for ALD are tetrakis(dimethylamino) tin, tetrakis (ethylmethylamino) tin, $N^2,N^3$-di-tert-butyl-butane-2,3-diamino-tin(II) and (1,3-bis(1,1-dimethylethyl)-4,5-dimethyl-(4R,5R)-1,3,2-diazastannolidin-2-ylidene. Oxygen-containing reactants include without limitation oxygen, ozone, water, hydrogen peroxide, and NO. Mixtures of oxygen-containing reactants can also be used. The deposition conditions will vary depending on the choice of ALD reactants, where more reactive precursors will generally react at lower temperatures than less reactive precursors. The processes typically will be carried out at a temperature of between about 20-500° C., and at a sub-atmospheric pressure. The temperature and pressure are selected such that the reactants remain in the gaseous form in the process chamber to avoid condensation. Each reactant is provided to the process chamber in a gaseous form either alone or mixed with a carrier gas, such as argon, helium, or nitrogen. The flow rates of these mixtures will depend on the size of the process chamber, and are in some embodiments between about 10-10,000 sccm.

A specific example of thermal ALD process conditions that are suitable for depositing a conformal $SnO_2$ layer provided herein is described in an article by Li et al. titled "Tin Oxide with Controlled Morphology and Crystallinity by Atomic Layer Deposition onto Graphene Nanosheets for Enhanced Lithium Storage" (*Advanced Functional Materials*, 2012, 22, 8, 1647-1654) which is herein incorporated by reference in its entirety. The process includes sequentially and alternately exposing the substrate in an ALD vacuum chamber to $SnCl_4$ (the tin-containing precursor) and deionized water (the oxygen-containing reactant) at a temperature of 200-400° C. In a specific example of an ALD cycle, a mixture of $SnCl_4$ vapor with $N_2$ carrier gas is introduced into the ALD process chamber for 0.5 seconds, and is then exposed to the substrate for 3 seconds. Next the ALD process chamber is purged with $N_2$ for 10 seconds to remove $SnCl_4$ from the bulk of the process chamber, and a mixture of $H_2O$ vapor with $N_2$ carrier gas is flowed into the process chamber for 1 second and is exposed to the substrate for 3 seconds. Next, the ALD process chamber is purged with $N_2$ and the cycle is repeated. The ALD process is performed at subatmospheric pressure (e.g., 0.4 Torr) and at a temperature of 200-400° C.

Another example of thermal ALD process conditions that are suitable for depositing SnO films in the methods provided herein, is given in an article by Du et al. titled "In situ Examination of Tin Oxide Atomic Layer Deposition using Quartz Crystal Microbalance and Fourier Transform Infrared Techniques" (*J. Vac. Sci. Technol.* A 23, 581 (2005)), which is herein incorporated by reference in its entirety. In this process the substrate is sequentially exposed to $SnCl_4$ and $H_2O_2$ in an ALD process chamber at a temperature of between about 150-430° C.

While the use of halogenated tin precursors in ALD is suitable in many embodiments, in some embodiments it is more preferable to use non-halogenated organotin precursors to avoid corrosion problems that may occur with the use of halogenated precursors such as $SnCl_4$. Examples of suitable non-halogenated organotin precursors include alkylaminotin (alkylated tin amide) precursors, such as tetrakis(dimethylamino) tin. An example of a suitable thermal ALD deposition method that uses this precursor is provided in an article by Elam et al., titled "Atomic Layer Deposition of Tin Oxide Films using Tetrakis(dimethylamino) tin" (*J. Vac. Sci. Technol.* A 26, 244 (2008)), which is herein incorporated by reference in its entirety. In this method the substrate is sequentially exposed in an ALD chamber to tetrakis(dimethylamino) tin and $H_2O_2$ at a temperature of between about 50-300° C. Advantageously, the use of this precursor allows deposition of $SnO_2$ films at low temperatures of 100° C. or less. For example, $SnO_2$ films can be deposited at 50° C. without the use of plasma to enhance reaction rate. Another example of thermal ALD of SnO using tetrakis(dimethylamino) tin and $H_2O_2$ is provided in an article by Elam et al. titled "Atomic Layer Deposition of Indium Tin Oxide Thin Films Using Nonhalogenated Precursors" (*J. Phys. Chem.* C 2008, 112, 1938-1945), which is herein incorporated by reference.

Another example of low temperature thermal ALD process with the use of a reactive organotin precursor is provided in an article by Heo et al., titled "Low temperature Atomic Layer Deposition of Tin Oxide" (*Chem. Mater.*, 2010, 22(7) 4964-4973), which is herein incorporated by reference in its entirety. In this deposition process (which is suitable for depositing $SnO_2$ films provided herein), the substrate is sequentially exposed in an ALD vacuum process chamber to $N^2,N^3$-di-tert-butyl-butane-2,3-diamino-tin(II) and 50% $H_2O_2$. These reactants are vaporized and each is provided to the process chamber mixed with an $N_2$ carrier gas. The chamber is purged with $N_2$ after each exposure of the substrate to a reactant. The deposition can be carried out at a temperature of between about 50-150° C.

While hydrogen peroxide generally works well as an oxygen-containing reactant for formation of $SnO_2$ in ALD processes, it may sometimes provide insufficient control over $SnO_2$ film growth due to $H_2O_2$ decomposition. In some embodiments, a more stable oxygen-containing precursor, such as NO, is used. An example of suitable process conditions with the use of NO as an oxygen-containing reactant is provided in an article by Heo et al., titled "Atomic Layer Deposition of Tin Oxide with Nitric Oxide as an Oxidant Gas" (*J. Mater. Chem.*, 2012, 22, 4599), which is herein incorporated by reference. The deposition involves exposing the substrate sequentially to a cyclic Sn(II) amide (1,3-bis (1,1-dimethylethyl)-4,5-dimethyl-(4R,5R)-1,3,2-diazastannolidin-2-ylidene and to NO at a temperature of about 130-250° C.

In some embodiments, $SnO_2$ films are deposited by PEALD. The same types of tin-containing precursors and oxygen-containing reactants as described above for thermal ALD can be used. In PEALD the ALD apparatus is equipped with a system for generating plasma in the process chamber, and for treating the substrate with the plasma. In a typical PEALD process sequence, the substrate is provided to the PEALD process chamber and is exposed to the tin-containing precursor which adsorbs on the surface of the substrate. The process chamber is purged with an inert gas (e.g., argon or helium) to remove the precursor from the process chamber, and the substrate is exposed to an oxygen-containing reactant which is introduced into the process chamber. Concurrently with the introduction of the oxygen-containing reactant or after a delay, plasma is formed in the process chamber. The plasma facilitates the reaction between the tin-containing precursor and the oxygen-containing reactant on the surface of the substrate that results in formation of $SnO_2$. Next, the process chamber is purged with an inert gas, and the cycle comprising tin precursor dosing, purging, oxygen-containing reactant dosing, plasma treatment, and second purging is repeated as many times as necessary to form a $SnO_2$ film of desired thickness.

An example of process conditions that are suitable for PEALD formation of $SnO_2$ film is provided in an article by Seop et al., titled "The Fabrication of Tin Oxide Films by Atomic Layer Deposition using Tetrakis(ethylmethylamino) tin Precursor" (*Transactions on Electrical and Electronic Materials*, 2009, 10, 5, 173-176), which is herein incorporated by reference. The substrate is provided into a PEALD process chamber and is exposed to tetrakis(ethylmethylamino) tin in an absence of plasma with an exposure of 4 seconds. Next, the tin-containing precursor is purged from the process chamber by flowing argon through the process chamber for 20 seconds. Then, $O_2$ is injected for 2 seconds with additional 2 seconds with radio frequency (RF) power of 100 W. This is followed by an argon purge, which completes one PEALD cycle. In this example, the process is conducted at a temperature range of 50-200° C. and at a pressure of 0.8 Torr.

While ALD (both thermal and plasma enhanced) is one of the preferred methods for depositing $SnO_2$ films, it is understood that other $SnO_2$ deposition methods, such as CVD, PECVD, and sputtering can also be used.

The second material (any of $SiO_2$, SiC, SiN, SiOC, SiNO, SiCNO, and SiCN) can be deposited by a variety of methods including PECVD, CVD, ALD, and PEALD. In some embodiments the second material is deposited by PECVD. In this method, a plasma is formed in a process gas comprising a silicon-containing precursor and a reactant that contains one or more elements of the second material, under conditions controlled for deposition of the second material on a substrate. For example, $SiO_2$ may be deposited by forming a plasma in a process gas comprising a silicon-containing precursor and an oxygen-containing reactant; SiC may be deposited by forming a plasma in a process gas comprising a silicon-containing precursor and a carbon-containing reactant; SiN may be deposited by forming a plasma in a process gas comprising a silicon-containing precursor and a nitrogen-containing reactant; SiOC may be deposited by forming a plasma in a process gas comprising a silicon-containing precursor an oxygen-containing reactant, and a carbon-containing reactant; SiNO may be deposited by forming a plasma in a process gas comprising a silicon-containing precursor an oxygen-containing reactant, and a nitrogen-containing reactant; SiCNO may be deposited by forming a plasma in a process gas comprising a silicon-containing precursor an oxygen-containing reactant, a carbon-containing reactant, and a nitrogen-containing reactant; and SiCN may be deposited by forming a plasma in a process gas comprising a silicon-containing precursor a carbon-containing reactant, and a nitrogen-containing reactant. In those cases, where the silicon-containing precursor further includes any of the necessary elements of the second material, the silicon-containing precursor and the reactant may be the same. For example, TEOS can serve both as a silicon-containing precursor and an oxygen-containing reactant during deposition of $SiO_2$. Examples of silicon-containing precursors include silane, disilane, tetraalkylsilanes, trialkylsilanes, siloxanes, TEOS, etc. Examples of oxygen-containing reactants include $CO_2$, $N_2O$, $O_2$, $O_3$, $H_2O$. Examples of nitrogen-containing reactants include $N_2$, and $NH_3$. Examples of carbon-containing reactants include hydrocarbons, such as methane, ethane, propane, etc. The process gases used for deposition of these materials, may also include a carrier gas, such as He, Ar, Ne, etc.

The $SnO_2$ etching methods that utilize hydrogen plasma can be implemented in a variety of apparatuses under a wide range of process conditions. The methods involve, in some embodiments, providing a semiconductor substrate having an exposed layer of tin oxide to an etch chamber, and contacting the substrate with a plasma formed in a process gas comprising $H_2$, and, optionally a carrier gas, such as helium or another inert gas. The term "etch chamber" or an "etching apparatus" refers to a chamber and an apparatus that are configured for etching. In some embodiments the "etch chamber" or the "etching apparatus" are exclusively configured for etching operations. In other embodiments the "etch chamber" or "etching apparatus" may be configured to perform other operations in addition to etching, such as, for example, deposition. For example, in some embodiments the etch chamber may also be used for ALD deposition.

In some embodiments the plasma used for in the hydrogen plasma etch is generated in the same process chamber that houses the semiconductor substrate. In other embodiments the plasma is generated remotely, and is introduced into the process chamber that houses the substrate through one or more inlets in the process chamber.

The etching is controlled such as to convert $SnO_2$ to volatile $SnH_4$. Preferably, the $H_2$ content in the process gas is at least about 50% by volume, such as at least about 80% by volume (can be up to and including 100%). In some embodiments, the process gas may further include a hydrocarbon, such as $CH_4$. In some embodiments, the process gas further includes $Cl_2$. For example, the process gas may consist essentially of $H_2$ and an inert gas (e.g., He), or the process gas may consist essentially of $H_2$, inert gas and a hydrocarbon (e.g., $CH_4$). The etch is performed at a temperature of less than about 100° C., measured near the substrate. The etch reaction, advantageously, generates only volatile materials, such as $SnH_4$, which can be easily removed from the etch process chamber by evacuation and/or purging. The etch process temperature is preferably selected to be less than about 100° C., because higher temperatures can lead to decomposition of formed $SnH_4$ and to formation of particles that can contaminate the process chamber and the substrate. The composition of the process gas and process conditions are selected such as to reduce or eliminate formation of particles during the etch. Significantly, the etch reaction does not require any significant sputtering component, and can be performed in an absence of external bias at the substrate, and in an absence of heavy ions (e.g., argon ions). Reducing sputtering component can be beneficial for increasing the etch selectivity relative to the second material on the substrate. Thus, in some embodiments etching is performed without providing an external bias to the substrate and/or involves using helium (a light gas) as the carrier gas, in order to reduce sputtering.

Plasma for the hydrogen plasma etch can be generated using a variety of frequencies (low and high). Examples of suitable frequencies include 400 KHz, 2 MHz, 13.56 MHz, 27 MHz or 2.45 GHz. Power used for plasma generation can range in some embodiments, from between about 50 W to 1,000 W corresponding to power density of between about 0.0018 and 0.36 $W/cm^2$. The bias at the substrate is optional, and bias power can range from about 0 to 500 W. Suitable gas flow rates per showerhead (for processing one 300 mm wafer) are:

i. $H_2$: 25 to 750 sccm;
ii. $Cl_2$: 0 to 500 sccm (e.g., 5-200 sccm);
iii. He: 0 to 500 sccm (e.g., 5-100 sccm); and
iv. $CH_4$: 0 to 500 sccm (e.g., 5-100 sccm).

The etch process can be performed, in some embodiments, at a pressure of between about 1 to 175 mTorr.

In some specific embodiments the plasma is generated using high frequency generation (e.g., 13.56 MHz or 27 MHz), and it is provided using plasma power of between about 200 to 500 W corresponding to power density of 0.07 and 0.18 $W/cm^2$. The power for the bias at the substrate is between about 0 and 200 W. Suitable gas flow rates per showerhead (for processing one 300 mm wafer) are:

i. $H_2$: 100 to 300 sccm;
ii. $Cl_2$: 0 to 200 sccm (e.g., 5-100 sccm);
iii. He: 0 to 100 sccm (e.g., 5-50 sccm);
iv. $CH_4$: 0 to 100 sccm (e.g., 5-50 sccm).

The etch process is performed in these embodiments at a pressure of between about 1 to 30 mTorr.

In some embodiments, prior to etch, the substrate, which includes the exposed $SnO_2$ layer also includes an exposed layer of a material selected from the group consisting of $SiO_2$, SiC, SiN, SiOC, SiNO, SiCNO, and SiCN, and the provided etching method etches the $SnO_2$ with high selectivity relative to these materials. In some embodiments the etch completely removes exposed $SnO_2$ from the surface of the substrate, without completely removing the material selected from the group consisting of $SiO_2$, SiC, SiN, SiOC, SiNO, SiCNO, and SiCN.

In another aspect, a method for forming air gaps on a substrate is provided, where $SnO_2$ is used as a removable spacer material in the formation of the air gaps. For example air gap spacers made of $SnO_2$ can be used in FinFET devices.

Conventional technologies use one or more of the following. In DRAM fabrication $SiO_2$ is used and is removed using HF. This chemistry has limited use due to chemical attack of other films by HF and issues to penetrate very high aspect ratio structures (>15:1). In logic fabrication the use of conventional FinFET air gap spacers can be too complicated due to too many steps. Further, no perfect choice of material combinations is available. The use of wet etching processes make the small feature and/or high aspect ratio feature processing problematic. These disadvantages are addressed herein by introducing $SnO_2$ air gap spacers and processing methods.

Figure 2:
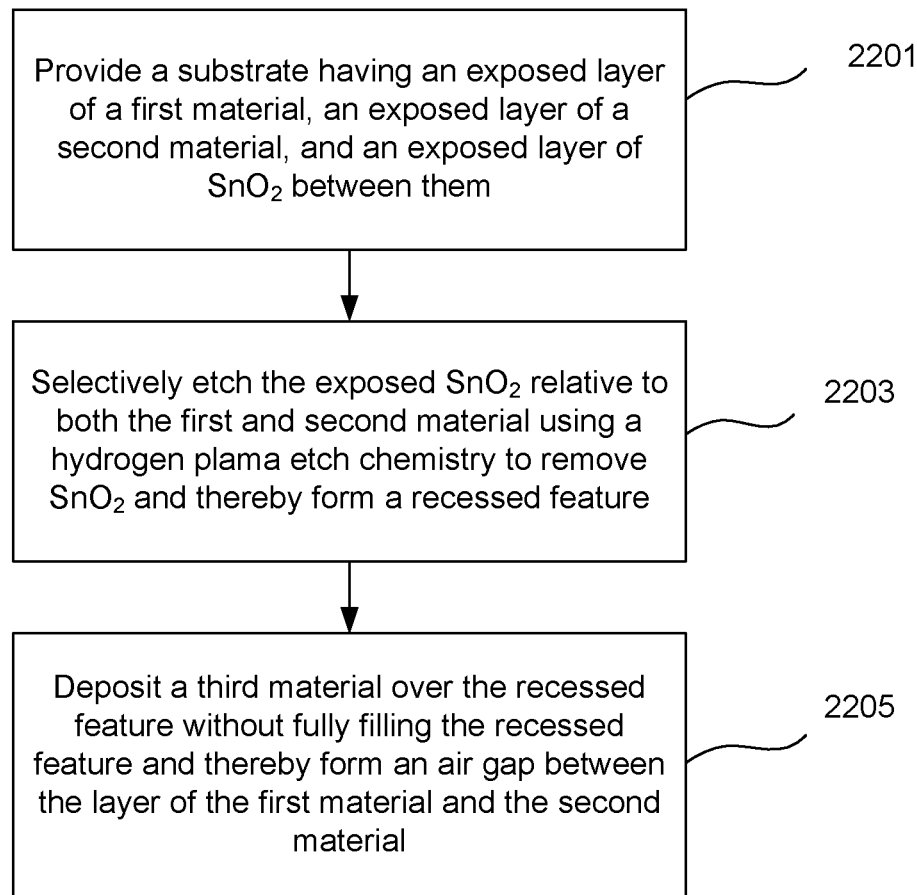
FIG. 2 is a process flow diagram for a processing method according to an embodiment provided herein.

FIG. 2 is a process flow diagram illustrating embodiments of a method of creating air gaps on a semiconductor substrate using removable $SnO_2$ spacers. The method starts in operation 2201 by providing a semiconductor substrate having an exposed layer of a first material, and exposed layer of a second material, and an exposed layer of $SnO_2$ positioned between the layer of the first material and the second material. The first and second materials may be the same material, or different materials. For example the first material, and the second material may be independently selected from $SiO_2$, SiC, SiN, SiOC, SiNO, SiCNO, and SiCN. In some embodiments, the first and second material are both $SiO_2$. In other embodiments the first material is $SiO_2$ and the second material is SiN. Generally, any combination of materials can be selected. Next, in operation 2203, the exposed $SnO_2$ is selectively etched relative to both the first material and the second material using the hydrogen plasma etch chemistry described herein. The etching removes $SnO_2$ in the presence of the exposed first and second materials and forms a recessed feature in place of the removed $SnO_2$. The etch selectivity of the $SnO_2$ removal relative to both the first and second materials is, preferably at least about 5, such as at least about 10, or at least about 50. Etch selectivities of greater than 80, such as 100 can also be achieved with the described methods. Next, in operation 2205, a third material is deposited over the recessed feature without fully filling the recessed feature, and thereby forming an air gap between the layer of the first material and the second material. The third material is any suitable material, and may be the same or different than each of the first and second materials. In some embodiments the third material is a dielectric. The third material, in some embodiments, is $SiO_2$, deposited, for example, by PECVD or HDP (high density plasma) CVD.

Advantageously, the etching processes for $SnO_2$ provided herein do not require wet etching, and do not require exposure to fluorine-containing chemistry. Advantageously, hydrogen plasma etch for $SnO_2$ can be performed on layers of $SnO_2$ having very narrow widths (e.g., 20-100 Å) without causing structural collapse of the device. Structural collapse is a problem that is encountered during wet etching of spacers having very small sizes. Generally, the widths of $SnO_2$ layer in air gap formation sequences can vary over a wide range (e.g., 10-5,000 Å), but the provided method is particularly advantageous for processing substrates with narrow $SnO_2$ spacers having widths of 20-100 Å.

Figure 3A:
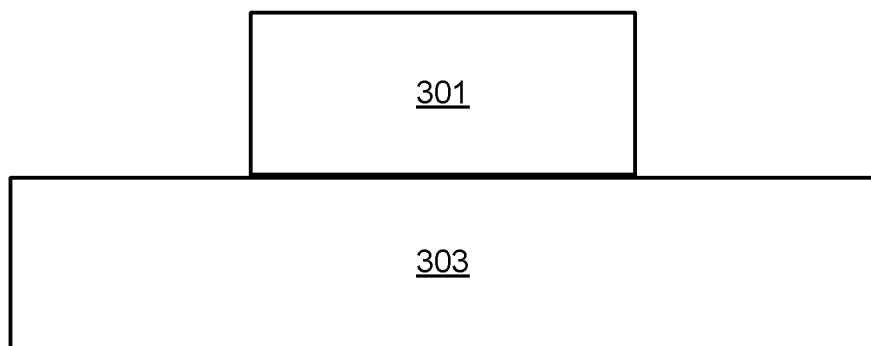
FIGS. 3A-3G show schematic cross-sectional views of a semiconductor substrate undergoing processing with air gap formation according to an embodiment described herein.
Figure 3B:
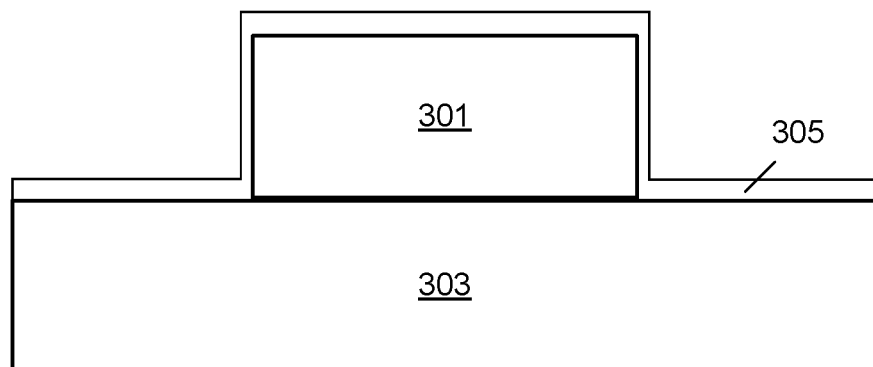
Figure 3C:
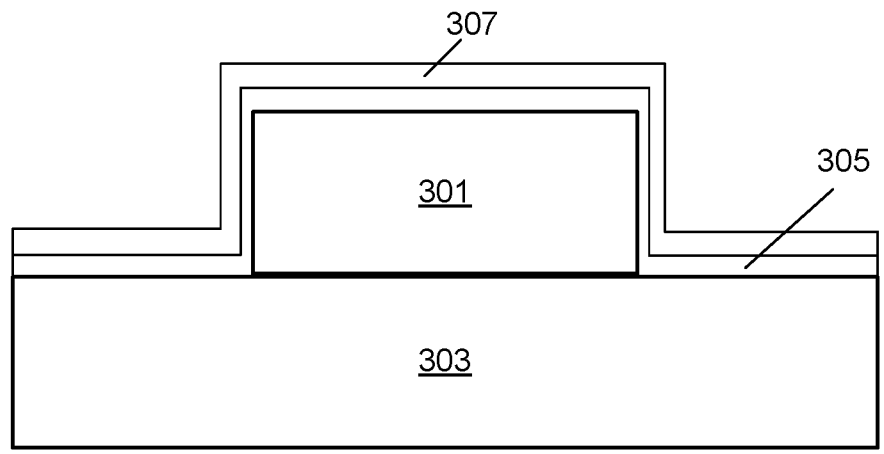
Figure 3D:
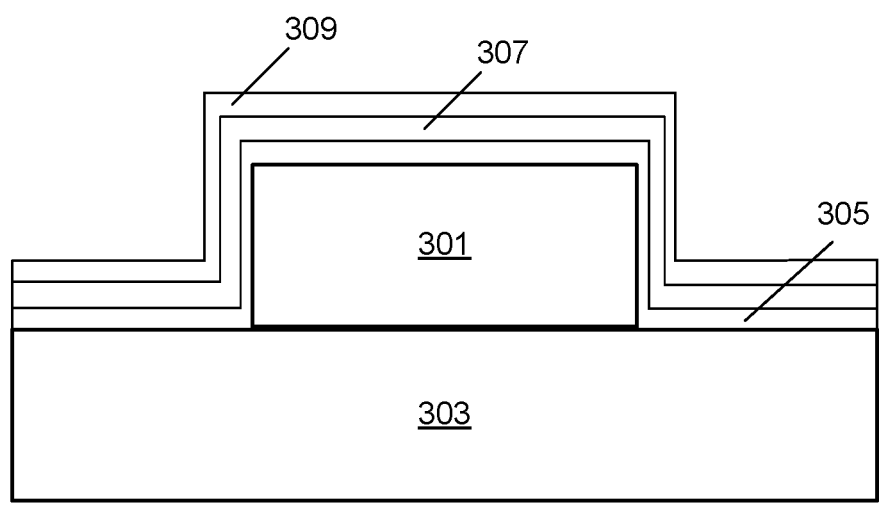
Figure 3E:
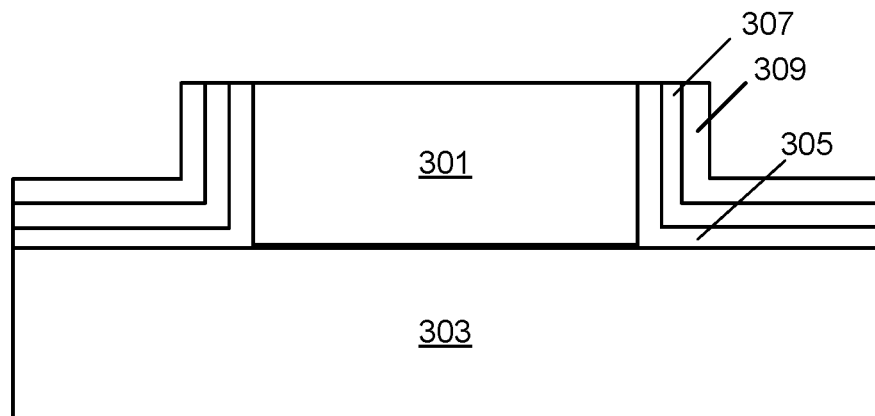

One example of a processing sequence for forming air gaps is provided in FIGS. 3A-3G that show cross-sectional schematic views of a semiconductor substrate during air gap formation, according to one of the embodiments. FIGS. 3A-3E illustrate processing steps that can be used to obtain a substrate that contains an exposed $SnO_2$ layer between exposed layers of the first and second materials. It is understood that a variety of other methods can be used to obtain such substrate. The illustrated method involves forming a gate 301 on the substrate 303, resulting in a structure shown in FIG. 3A. The gate is a protruding feature on the substrate. In some embodiments the gate 301 is a high-k oxide, such as, for example, hafnium oxide. Next, as illustrated in FIG. 3B, layer 305 of a first material is formed conformally over the substrate such that it covers the substrate 303 and the gate 301. Importantly, layer 305 covers the gate both at the gate sidewalls and over the top surface of the gate 301. In one illustrative example the layer 305 is a SiN layer. Conformal deposition can be achieved, for example, by ALD. Next, a layer of $SnO_2$ 307 is formed conformally over layer 305, as shown in FIG. 3C. $SnO_2$ layer 307 resides in contact with the underlying layer 305 and resides over the substrate 303 and over the gate 301. The $SnO_2$ layer covers the gate both at the gate sidewalls and the top surface of the gate. The $SnO_2$ layer can be deposited by ALD or PECVD. Next, a layer of a second material 309 is deposited conformally over the substrate onto the $SnO_2$ layer 307 resulting in a structure shown in FIG. 3D. In some embodiments the second material is $SiO_2$. The second material contacts the $SnO_2$ layer and resides over the substrate 303 and the gate 301, covering the gate both at its sidewalls and its top surface. In the next step, the structure is planarized (e.g., using chemical mechanical polishing). This step removes the layer of the second material (e.g., $SiO_2$) from the top surface of the gate, and exposes $SnO_2$ layer at the sidewalls of the gate. The structure shown in FIG. 3E illustrates the substrate after planarization. It shows that the exposed $SnO_2$ layer 307 resides between exposed layer of the first material 305 and the exposed layer of the second material 309 at the sidewalls of the gate. This structure is one possible structure that can be used in step 2201 of the process flow diagram shown in FIG. 2. If the $SnO_2$ layer is deposited substantially conformally, the thickness of the $SnO_2$ layer deposited on the horizontal surfaces will be similar to the width of the $SnO_2$ layer exposed at the sidewalls of the gate. For example, if $SnO_2$ is deposited to a thickness of between about 20-100 Å, the exposed $SnO_2$ layer at the sidewall of the gate would have the width of between about 20-100 Å.

Figure 3F:
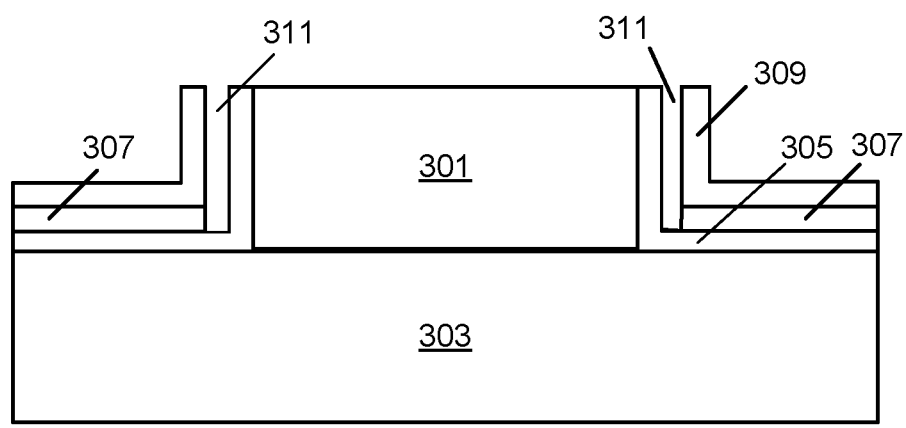
Figure 3G:
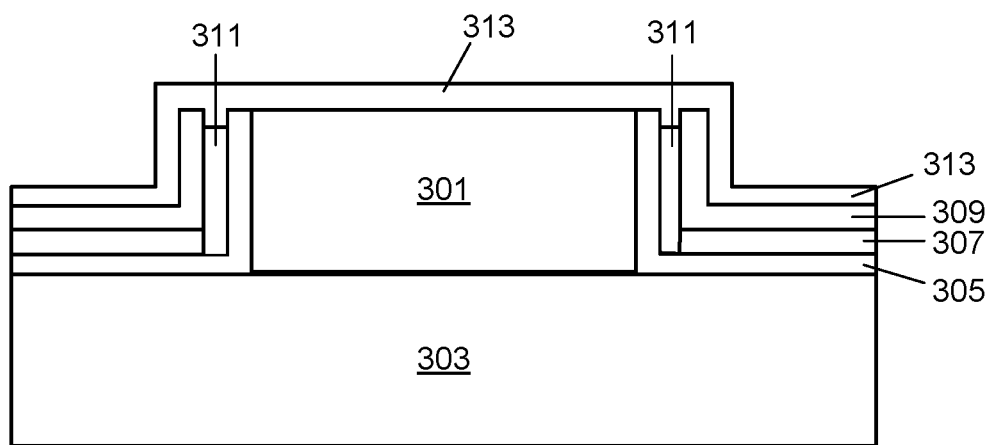

Next, hydrogen plasma etching is performed, as described herein. The substrate shown in FIG. 3E is contacted with a plasma formed in a process gas comprising $H_2$ in an etch process chamber, and the exposed $SnO_2$ layer 307 is selectively etched (relative to other exposed materials) to form a recessed feature between the layer of the second material 309 and the layer of the first material 305. The resulting structure is shown in FIG. 3F, which illustrates the recessed feature 311 between layers 309 and 305. Finally, in the subsequent step a layer of a third material (e.g., $SiO_2$) 313 is deposited, e.g., by HDP CVD such that it covers the recessed feature 311 without fully filling it, thereby creating an air gap.

A more specific example of a method for forming an air gap includes: (a) forming a gate on a substrate, where the gate includes high-k oxide; (b) conformally depositing a SiN layer by ALD in contact with the gate (both on the sidewalls of the gate and on the top surface of the gate); (c) conformally forming a layer of $SnO_2$ over the layer of the SiN layer, e.g., by ALD or PECVD; (d) conformally forming a $SiO_2$ layer over the layer of $SnO_2$; (e) planarizing the structure (e.g., by chemical mechanical polishing), wherein planarization removes the $SiO_2$ from the horizontal surfaces and exposes $SnO_2$ and the first material at the sidewalls of the gate thereby providing a substrate having an exposed SiN layer, an exposed $SiO_2$ layer, and an exposed layer of $SnO_2$ positioned between these layers; (f) etching the exposed $SnO_2$ using hydrogen plasma as described herein with high etch selectivity relative to SiN and $SiO_2$, and thereby forming a recessed feature between SiN and $SiO_2$ layers; and (g) depositing a SiO$_2$ over the recessed feature without fully filling the recessed feature, and thereby forming the air gap between the layers of the first and second materials. The width of the SnO$_2$ layer that is deposited and is removed by the hydrogen plasma etch in some embodiments, is between about 20-100 Å.

A detailed processing scheme for forming air gaps in FinFET device fabrication is described in the commonly owned U.S. Pat. No. 9,515,156, by Besser et al., titled "Air Gap Spacer Integration For Improved Fin Device Performance" issued Dec. 6, 2016, which is herein incorporated by reference in its entirety for the purpose of describing an air gap formation method that can be used in conjunction with the SnO$_2$ spacers provided herein. Methods for forming air gaps in the context of FinFET device fabrication according to some embodiments are described herein with reference to FIGS. 4A-4T, which show perspective views of a semiconductor substrate during various stages of FinFET device fabrication.

In some embodiments FinFET devices with air gap spacers and methods for integrating air gaps using sacrificial SnO$_2$ spacers into FinFET devices are provided. Air gap spacers are formed using a sacrificial SnO$_2$ spacer during integration. The sacrificial spacer is subsequently removed after self-aligned source/drain contact formation. The air gap spacer reduces FinFET parasitic capacitance. Low parasitic capacitance can be achieved without loss of process window or relaxing of lithography overlay requirements.

Figure 4A:
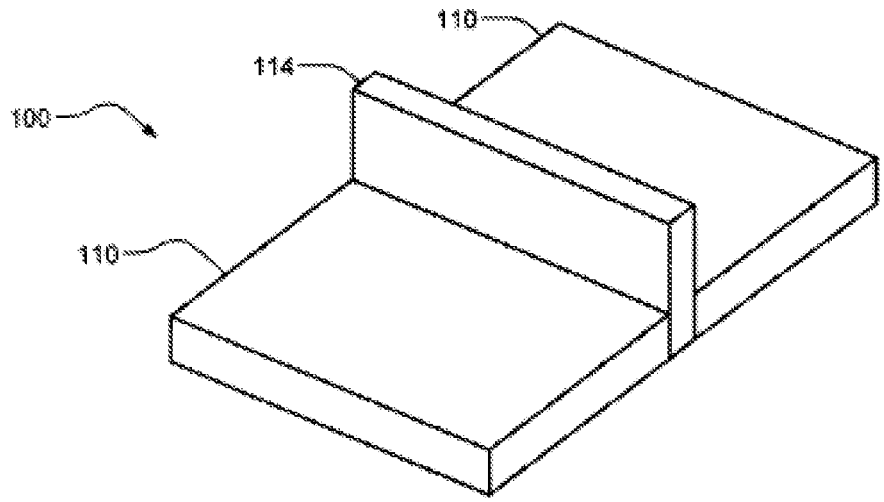
FIGS. 4A-4T show schematic views of a semiconductor substrate undergoing processing during FinFET device fabrication according to embodiments described herein.
Figure 4B:
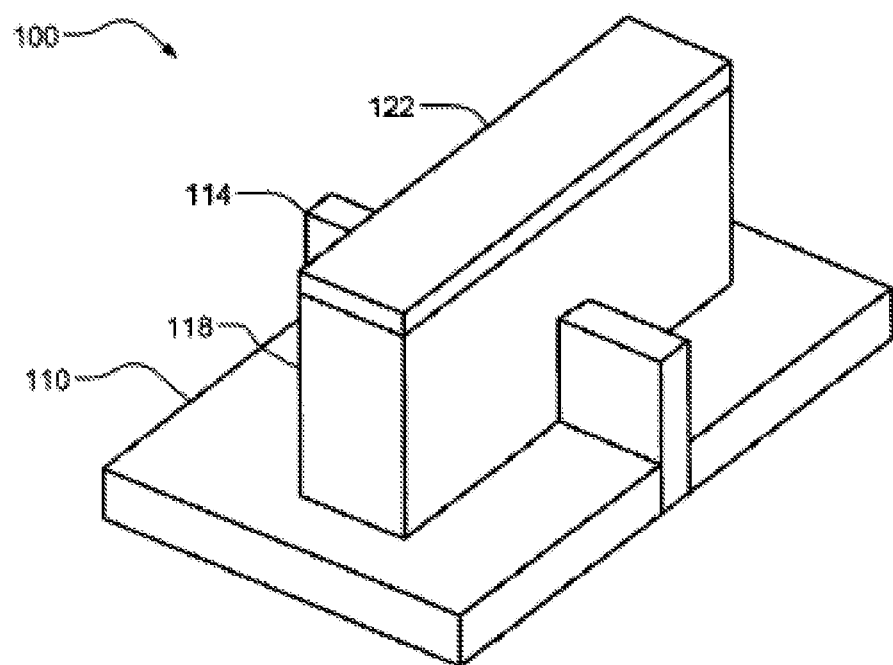

Referring now to FIGS. 4A-4B, the substrate is shown after shallow trench isolation (STI) recess etch and dummy gate formation, respectively. In FIG. 4A, the substrate 100 includes an inter-layer dielectrc (ILD) layer 110 and a plurality of fins 114. The ILD layer 110 may be made of low k dielectrics, doped oxides, flowable oxides, silicon dioxide (SiO$_2$) or other suitable material. In some examples, the plurality of fins 114 may be made of silicon (Si) with intervening STI oxide. STI oxide may also be located on a top surface of the plurality of fins 114.

In FIG. 4B, a dummy gate 118 is deposited over the plurality of fins 114 and etched. In some examples, the dummy gate 118 is arranged on the ILD layer 110 and extends transverse to the plurality of fins 114. In some examples, the dummy gate 118 is made of polysilicon. A hardmask layer 122 may be used to mask the dummy gate 118 during etching.

Figure 4C:
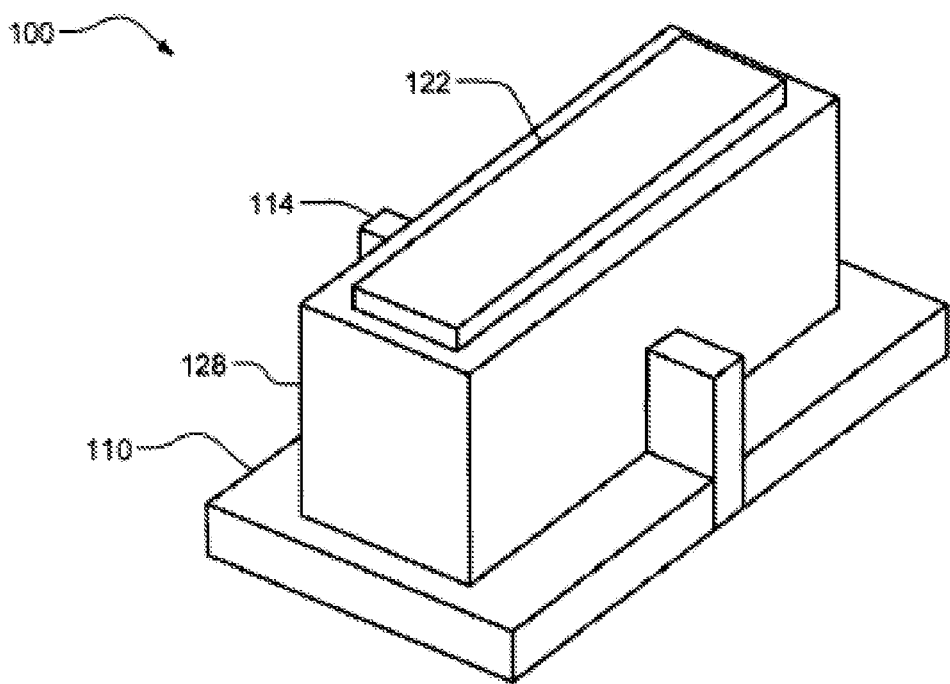
Figure 4D:
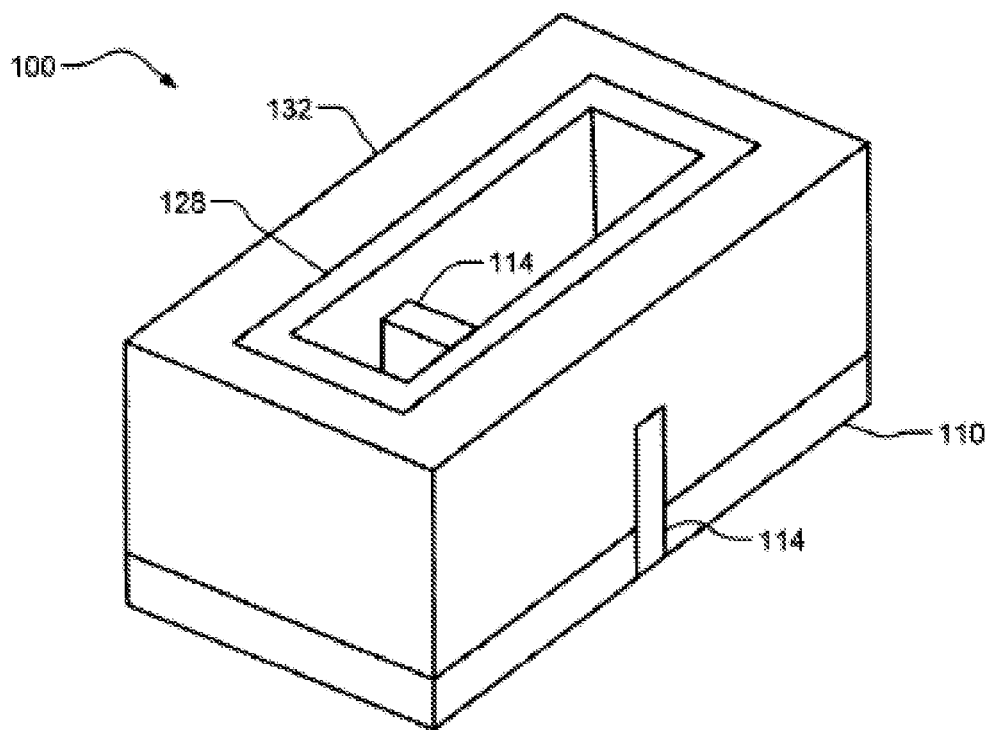

Referring now to FIGS. 4C-4D, a sacrificial SnO$_2$ spacer is deposited and etched and the dummy gate is removed, respectively. In FIG. 4C, a sacrificial SnO$_2$ spacer 128 is deposited around an outer surface of the dummy gate 118 and etched, e.g., using a hydrogen plasma etch described herein. In FIG. 4D, ILD layer 132 is deposited around the sacrificial SnO$_2$ spacer 128. In addition, the dummy gate 118 and the hardmask layer 122 are removed by etching or ashing. In some examples, the silicon forming the dummy gate 118 is selectively etched relative to the SnO$_2$ and the silicon dioxide (SiO$_2$) material of the substrate 100.

Figure 4E:
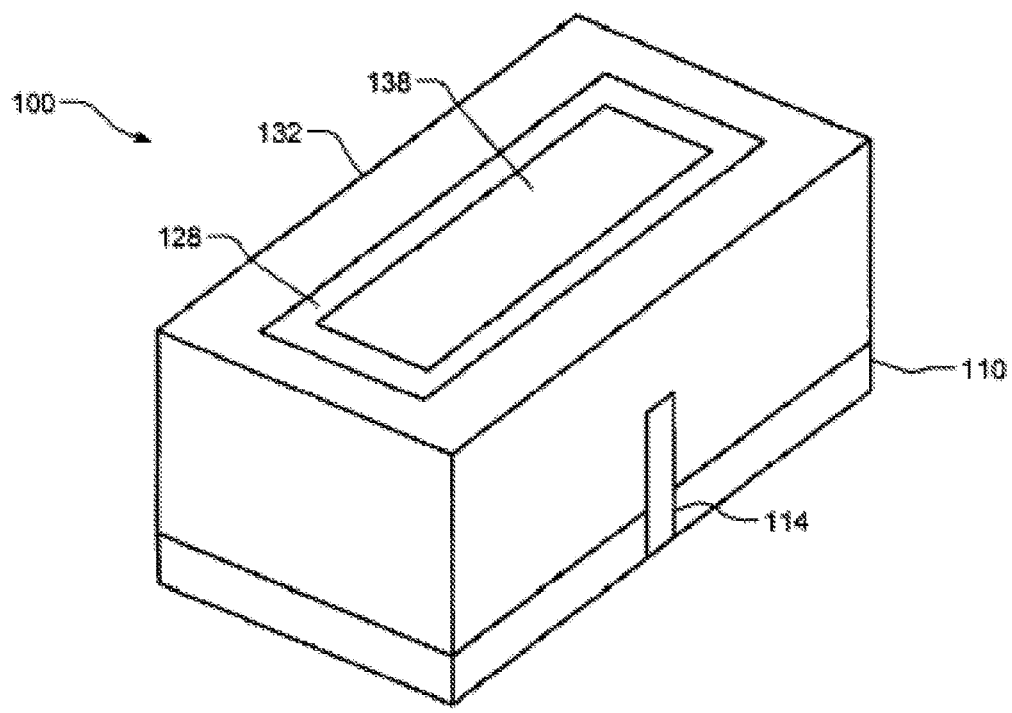

In FIG. 4E, replacement metal gate (RMG) formation is shown. A replacement metal gate (RMG) 138 is deposited in a former location of the dummy gate 118. In some examples, the RMG 138 has a high dielectric (HK) constant in a predetermined thickness between 1 and 10 nm. In some examples, the RMG 138 is made of high dielectric constant materials such as hafnium oxide (HfO$_2$), HfSiO$_2$, aluminum oxide (AlP$_3$), zirconium oxide (ZrO$_2$) or titanium oxide (TiO$_2$); a metal work function-setting material such as titanium nitride (TiN), titanium aluminum nitride (TiAlN), tungsten nitride (WN$_x$) (where x is an integer), tungsten carbon nitride (WCN$_x$), cobalt (Co), or other metals; and a bulk conductive metal such as tungsten (W), cobalt (Co) or aluminum (Al) and alloys thereof. In some examples, chemical mechanical polishing (CMP) may be performed after deposition of the RMG 138. In some examples, the top surface of the RMG 138 is coplanar with a top surface of the sacrificial SnO$_2$ spacer 128 and the ILD layer 132 after CMP.

Figure 4F:
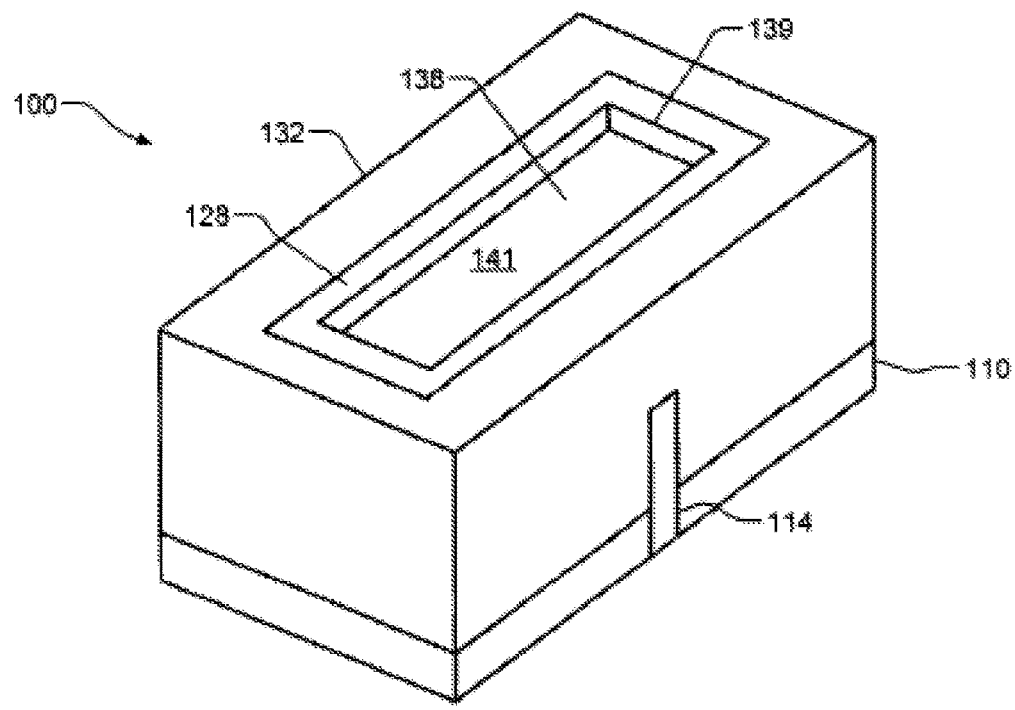

Referring now to FIG. 4F, the RMG 138 is selectively and partially etched relative to the SnO$_2$ and the silicon dioxide (SiO$_2$). More particularly, the RMG 138 is partially and selectively etched in a downward direction relative to the top surfaces of the sacrificial SnO$_2$ spacer 128 and the ILD layer 132 to create a recess 139 in the RMG 138. A top surface 141 of the RMG 138 is located below a plane including the top surfaces of the sacrificial SnO$_2$ spacer 128 and the ILD layer 132.

Figure 4G:
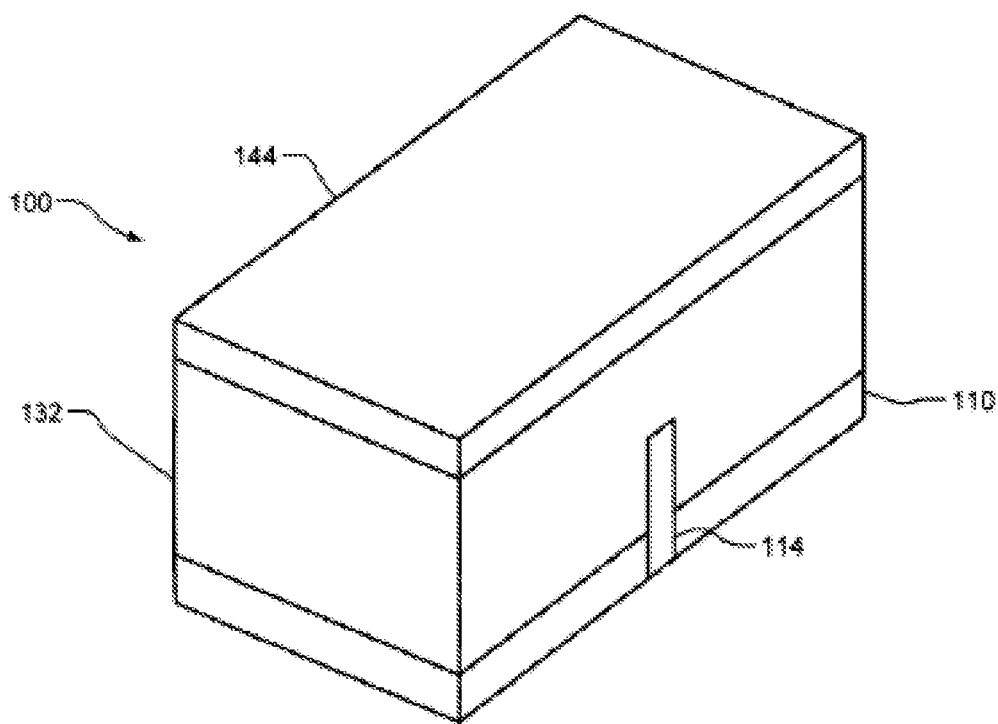
Figure 4H:
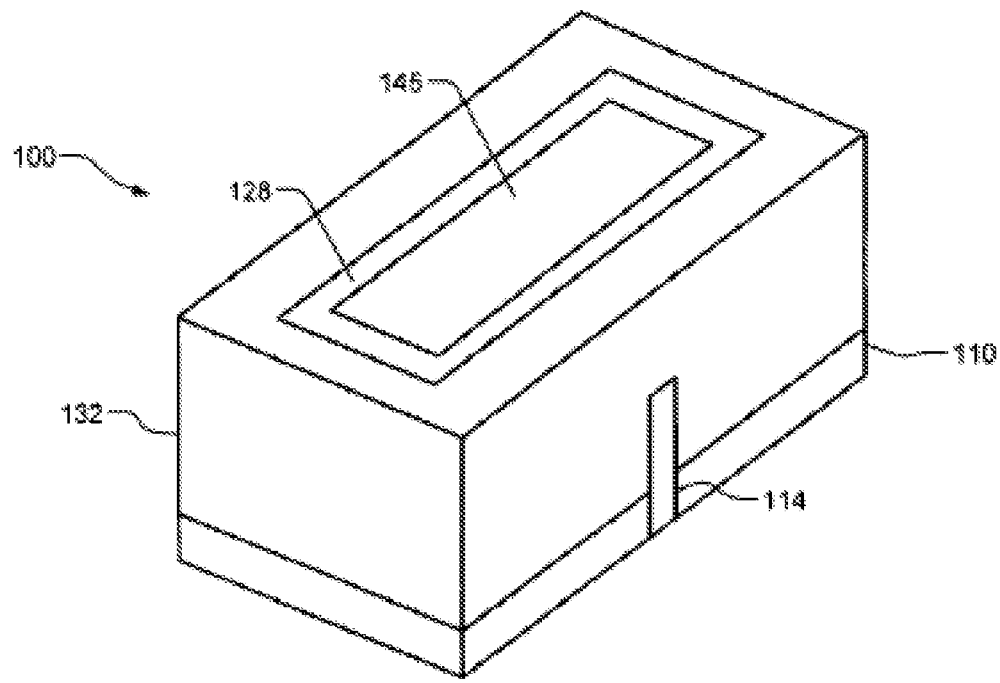

Referring now to FIGS. 4G-4H, gate capping layer deposition and gate capping layer chemical mechanical polishing (CMP) are shown, respectively. In FIG. 4G, a gate capping layer 144 is deposited in the recess in the RMG 138 and on the top surface of the substrate 100. In some examples, the gate capping layer 144 may be made of silicon oxycarbide (SiOC) or another suitable material. In some examples, the gate capping layer 144 is deposited using a process as described in commonly-assigned U.S. Patent Application Publication No. 2013/0330935, by Varadarajan et al., entitled "Remote Plasma Based Deposition of SiOC Class Films", which was published on Dec. 12, 2013, and which is hereby incorporated by reference in its entirety. In some examples, the gate capping layer 144 is deposited using a remote plasma process described therein. In FIG. 4H, CMP of the gate capping layer 144 is performed to create a gate capping layer 145 to the RMG 138. In some examples, the top surface of the gate capping layer 145 is coplanar with a top surface of the sacrificial SnO$_2$ spacer 128 and the ILD layer 132 after the CMP.

Figure 4I:
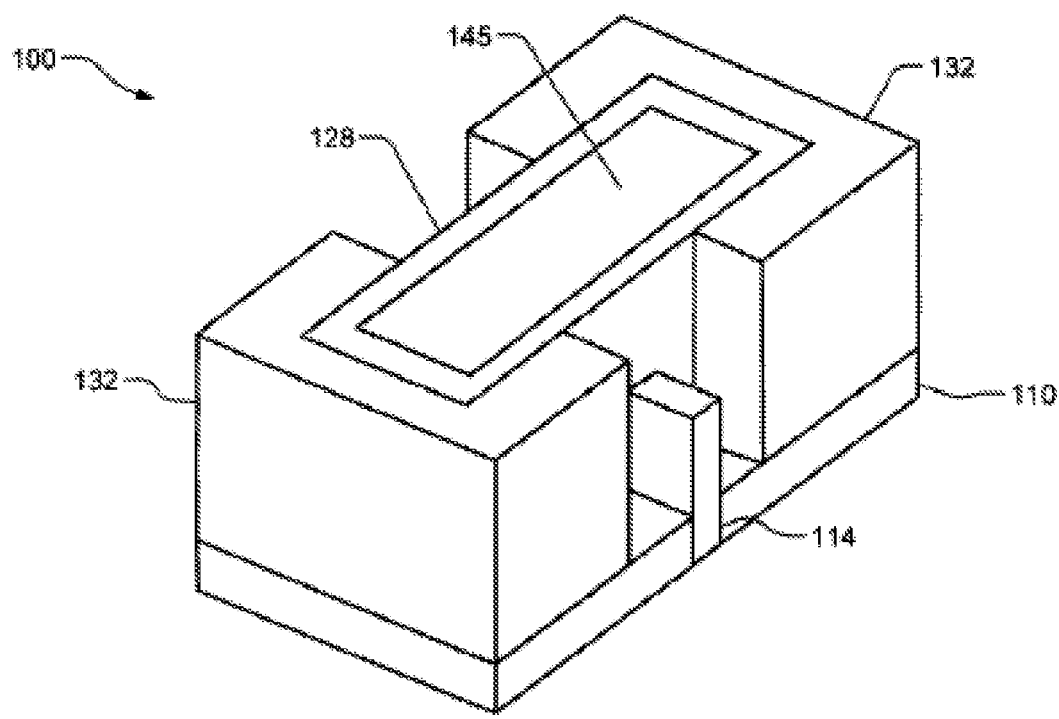
Figure 4J:
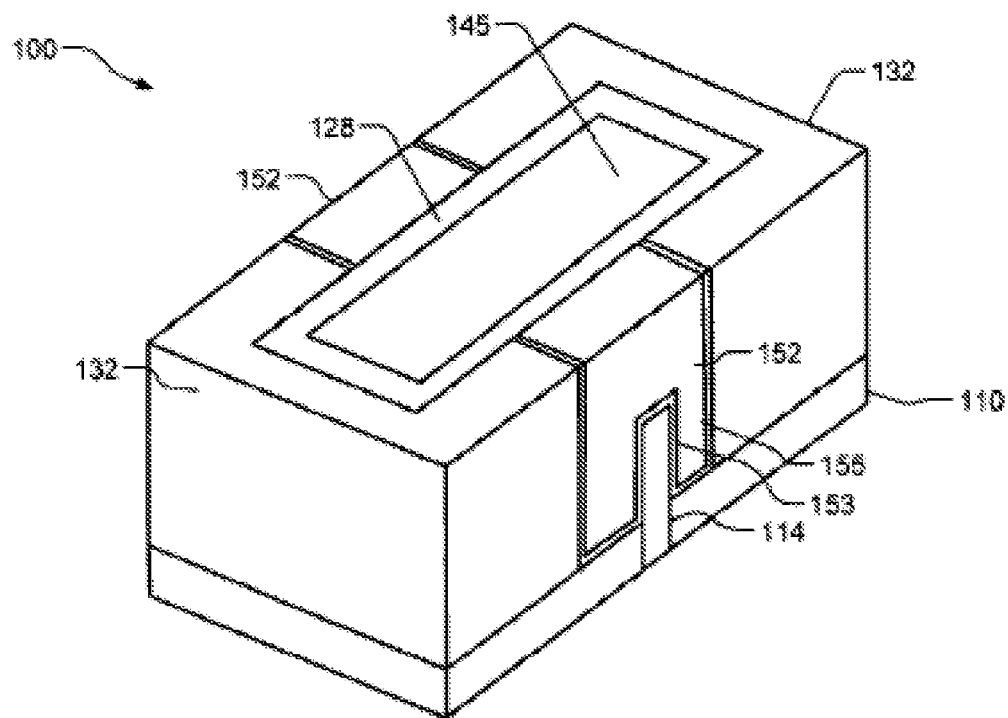

Referring now to FIGS. 4I-4J, self-aligned contact (SAC) area etch, SAC fill and sacrificial spacer removal are shown, respectively. In FIG. 4I, areas of the ILD layer 132 surrounding opposite sides of the plurality of fins 114 are masked and etched using an etch which etches ILD selective to the gate capping layer and sacrificial SnO$_2$ spacer to expose the plurality of fins 114 and to create a self-aligned contact area.

Figure 4K:
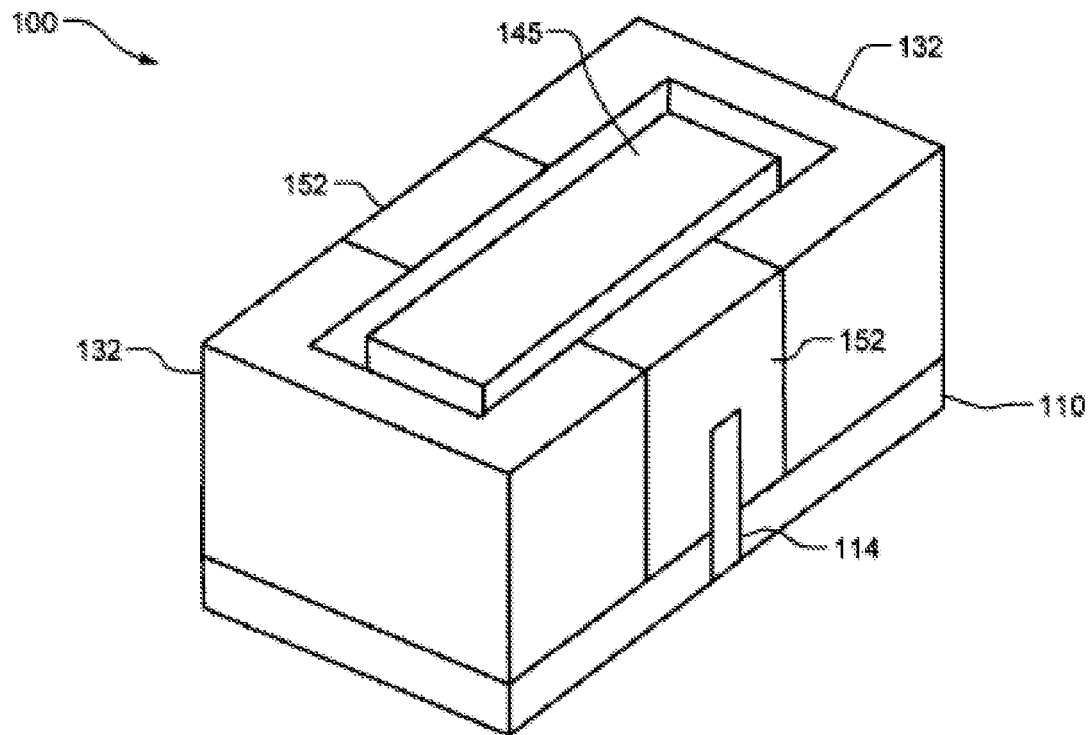

In FIG. 4J, the self-aligned contact area is filled with SAC material 152. In some examples, the SAC material 152 includes metal layers 155 or barrier layers 153 and metal layers 155 deposited on the barrier layers 153. In some examples, the barrier layers 153 include a titanium (Ti) and titanium nitride (TiN) bilayer and the metal layers 155 include tungsten (W), although other materials can be used, such as WCN$_x$ for the barrier and Co for the metal layer. In FIG. 4K, the sacrificial SnO$_2$ spacer 128 is removed. For example, etching of the sacrificial SnO$_2$ spacer 128 can be performed using hydrogen plasma etch methods described herein, selectively to exposed materials. For example, SnO$_2$ material may reside between a SiOC layer 145 and an ILD layer (e.g., doped or undoped SiO$_2$) 132, and may be selectively etched relative to these materials using hydrogen plasma.

Figure 4L:
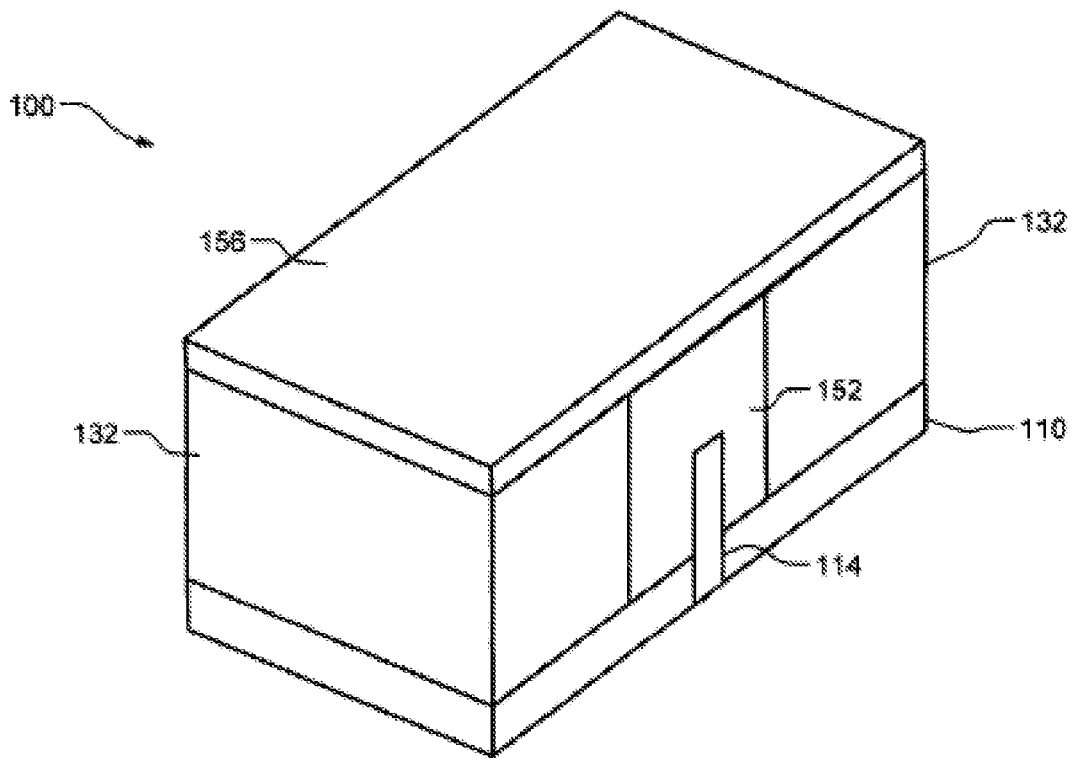
Figure 4M:
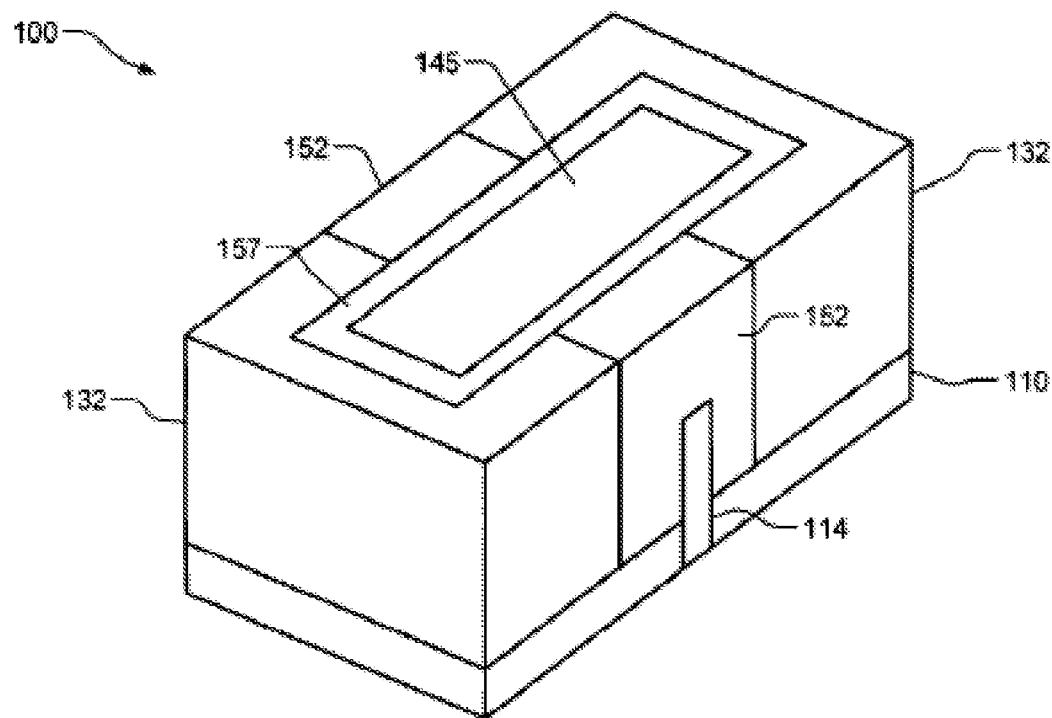
Figure 4N:
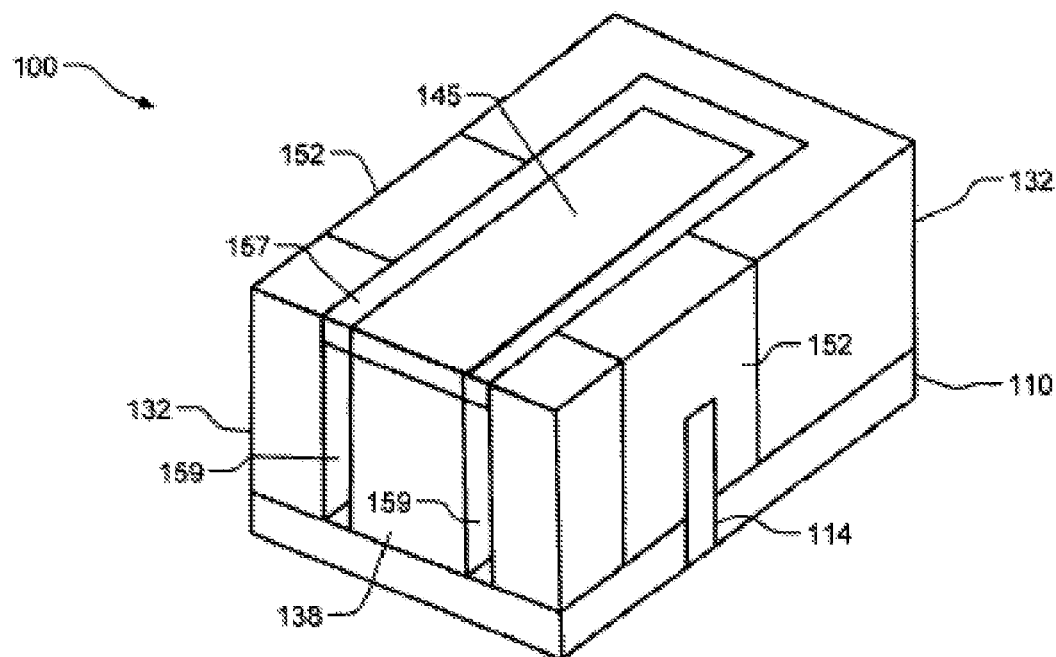

Referring now to FIGS. 4L-4N, a seal layer is deposited on the substrate and CMP is performed to create an air gap spacer. In FIG. 4L, a seal layer 156 is deposited on a top surface of the substrate 100. During deposition, an upper portion of an air gap 159 created after the sacrificial SnO$_2$ spacer 128 is removed, is partially filled by the seal layer 156. In some examples, the seal layer 156 is made of ILD, silicon dioxide (SiO$_2$), SiO$_2$ with carbon doping, or silicon oxycarbide (SiOC). In some examples, the seal layer 156 is deposited using plasma enhanced chemical vapor deposition (PECVD), although other deposition processes may be used.

In some examples, the seal layer 156 includes SiOC that is deposited using plasma enhanced chemical vapor deposition as described in commonly-assigned U.S. Patent Application Publication No. 2013/0330935, entitled "Remote Plasma Based Deposition of SiOC Class Films", which was previously incorporated by reference.

In FIG. 4M, CMP is used to remove a portion of the seal layer 156 located on the top surface of the substrate 100 to create an air gap seal 157. In some examples, the top surface of the air gap seal 157 is coplanar with a top surface of the gate capping layer 145 and the ILD layer 132 after CMP. In FIG. 4N, a cross-section of the substrate taken along a plane parallel to and spaced from the plurality of fins 114 is shown. The air gap 159 is located below the air gap seal 157.

Figure 4O:
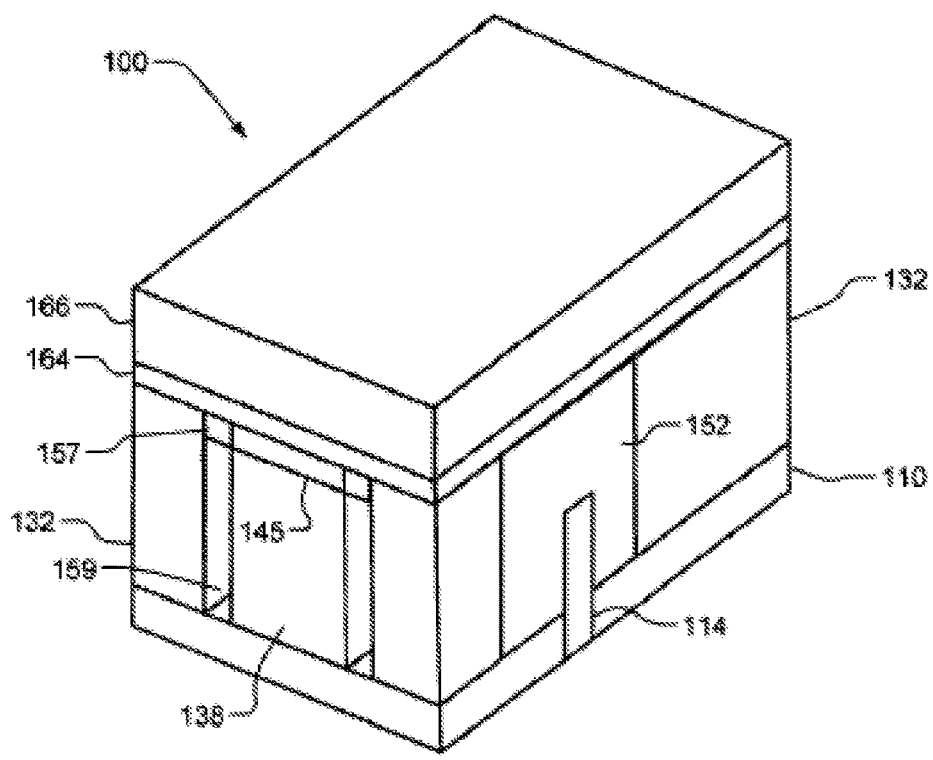

Referring now to FIG. 4O, an etch stop layer 164 is deposited on the top surface of the substrate 100. In some examples, the etch stop layer 164 includes SiOC, although other materials may be used. In some examples, the SiOC is deposited as described in commonly-assigned U.S. Patent Application Publication No. 2013/0330935, entitled "Remote Plasma Based Deposition of SiOC Class Films", which was previously incorporated by reference. ILD layer 166 is deposited on the etch stop layer 164.

Figure 4P:
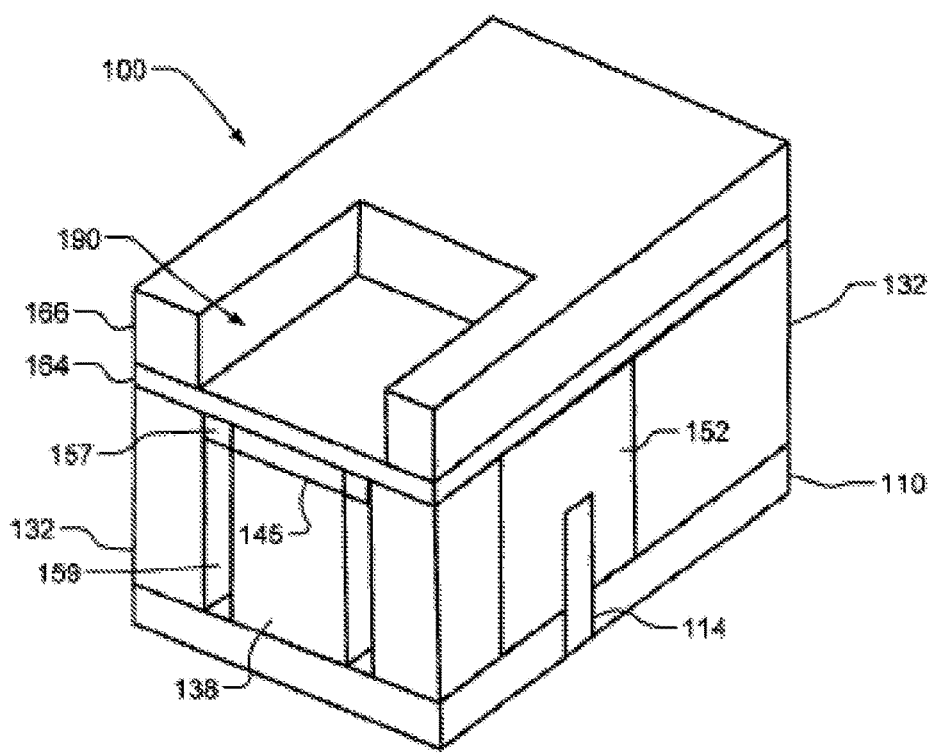
Figure 4Q:
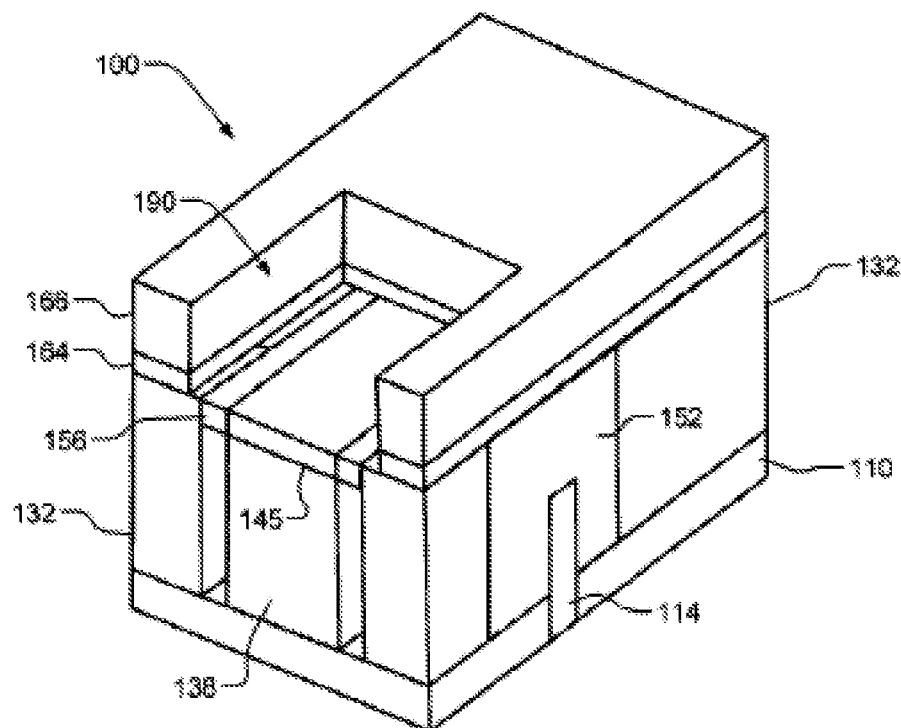

Referring now to FIGS. 4P-4T, various different etching steps are performed to open up different portions of the substrate. In FIGS. 4P-4Q, an example of various etch steps are shown. In FIG. 4P, the ILD layer 166 is etched to selectively expose underlying layers in a portion 190 of the etch stop layer 164. In FIG. 4Q, the etch stop layer 164 is etched to open up portions of the gate capping layer 145, the air gap seal 157, the metal layers 155 and the ILD layer 132 for further processing.

Figure 4R:
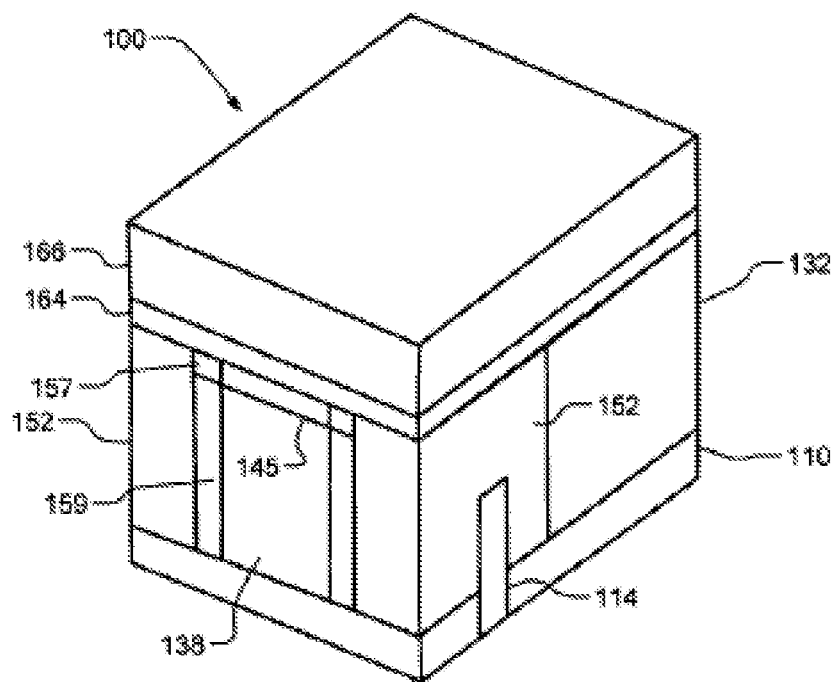
Figure 4S:
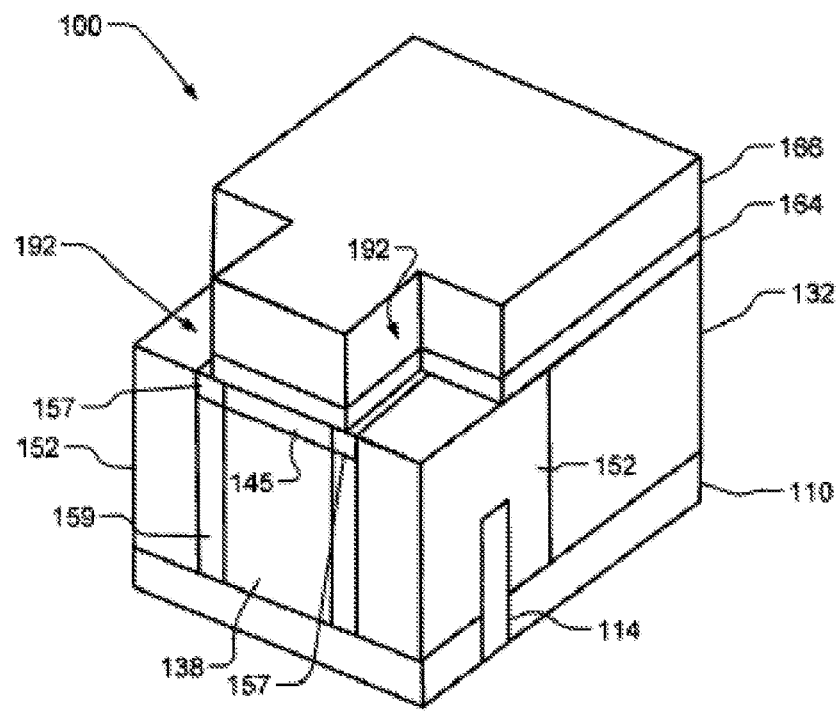

In FIGS. 4R and 4S, the ILD layer 166 and the etch stop layer 164 are etched to selectively expose underlying layers in portions 192 of the substrate 100. In FIG. 4S, different portions of the air gap seal 157, the metal layers 155 and the ILD layer 132 are opened up for further processing.

Figure 4T:
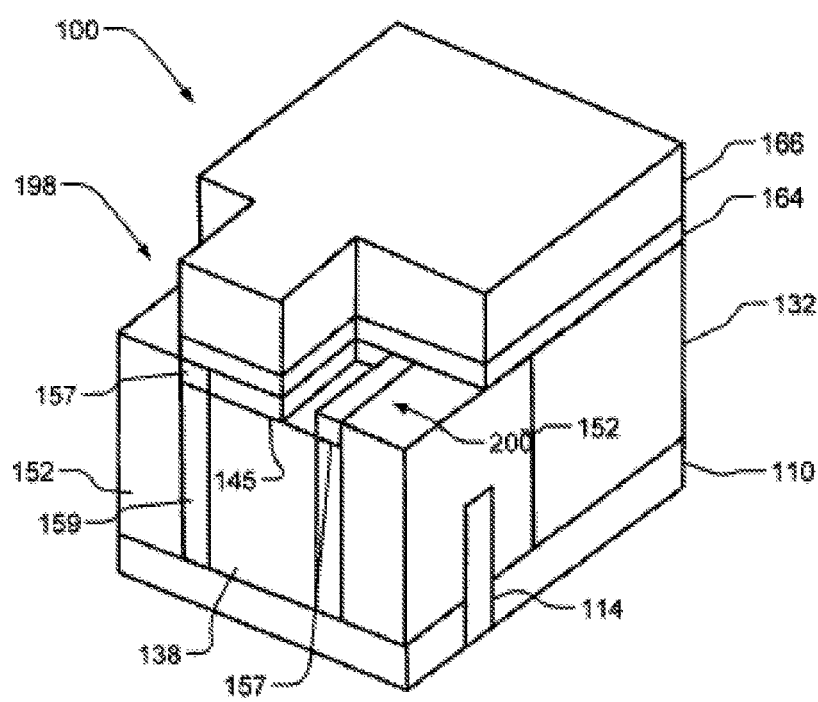

In FIG. 4T, the ILD layer 166 is patterned and etched to expose underlying layers in portions 198 and 200 of the substrate 100. Portions of the air gap seal 157, the metal layers 155, the RMG 138 and the ILD layer 132 are opened up for further processing. As can be appreciated, various other sublayers may be opened up for further processing.

OTHER EMBODIMENTS

In various other embodiments SnO$_2$ layers and hydrogen plasma etch can be used in the following applications.

In some embodiments, SnO$_2$ layers are used as dummy gates instead of commonly used polysilicon dummy gates. For example, the process flow, previously described with reference to FIGS. 4A-4T, is modified in this embodiment such that the dummy gate 118 is made of SnO$_2$, while the spacer 128 is made from a material that does not include SnO$_2$. For example, in this embodiment the spacer 128 may be a SiN spacer. The modified method involves etching the dummy gate 118 using H$_2$ plasma chemistry for the dummy gate removal. In one implementation, the method involves forming an SnO$_2$ dummy gate on the semiconductor substrate; processing the semiconductor substrate in a presence of the SnO$_2$ dummy gate, where processing may involve deposition and/or etching of materials on the semiconductor substrate; etching the SnO$_2$ dummy gate with a plasma formed in a process gas comprising H$_2$ to form a recessed feature in place of the dummy gate and depositing a high-k dielectric material into the formed recessed feature to thereby form a gate in place of the dummy gate. In some embodiments the hydrogen plasma etch during dummy gate removal involves etching using a plasma formed at a process gas comprising at least about 50% H$_2$ and at a temperature of less than about 100° C. The etching in some embodiments is performed selectively to one or more materials selected from the group consisting of SiO$_2$, SiC, SiN, SiOC, SiNO, SiCNO, and SiCN, where these materials may be exposed on the substrate before etch or may become exposed during the etch. The benefits of using SnO$_2$ for the dummy gate, and H$_2$ plasma for dummy gate etch include easy removal of SnO$_2$ selective to SiO$_2$ and low-k spacer, and high temperature resistance.

In other embodiments, SnO$_2$ layers are used as high-resistance resistors in BEOL applications. This is a useful application because polysilicon is not available in BEOL.

In other embodiments SnO$_2$ layers are used as an implant screen. This application requires low deposition temperature, which is available for SnO$_2$ deposition, and highly selective removal, which can be achieved by hydrogen plasma etch. Advantageously, no HF dipping is required when hydrogen plasma removal is used.

APPARATUS

The hydrogen plasma etching methods described herein can be carried out in a variety of apparatuses. A suitable apparatus includes an etch process chamber, a substrate holder in the etch process chamber configured to hold the substrate in place during etching, and a plasma generating mechanism configured for generating a plasma in a process gas.

Examples of suitable apparatuses include inductively coupled plasma (ICP) reactors which, in certain embodiments, may also be suitable for cyclic deposition and activation processes, including atomic layer etching (ALE) operations and atomic layer deposition (ALD) operations. Such ICP reactors have also been described in U.S. Pat. No. 9,362,133, issued on Jun. 7, 2016, and titled "Method for Forming a Mask by Etching Conformal Film on Patterned Ashable Hardmask", which is hereby incorporated by reference in its entirety and for all purposes. Although ICP reactors are described herein in detail, it should be understood that capacitively coupled plasma reactors may also be used.

Figure 5:
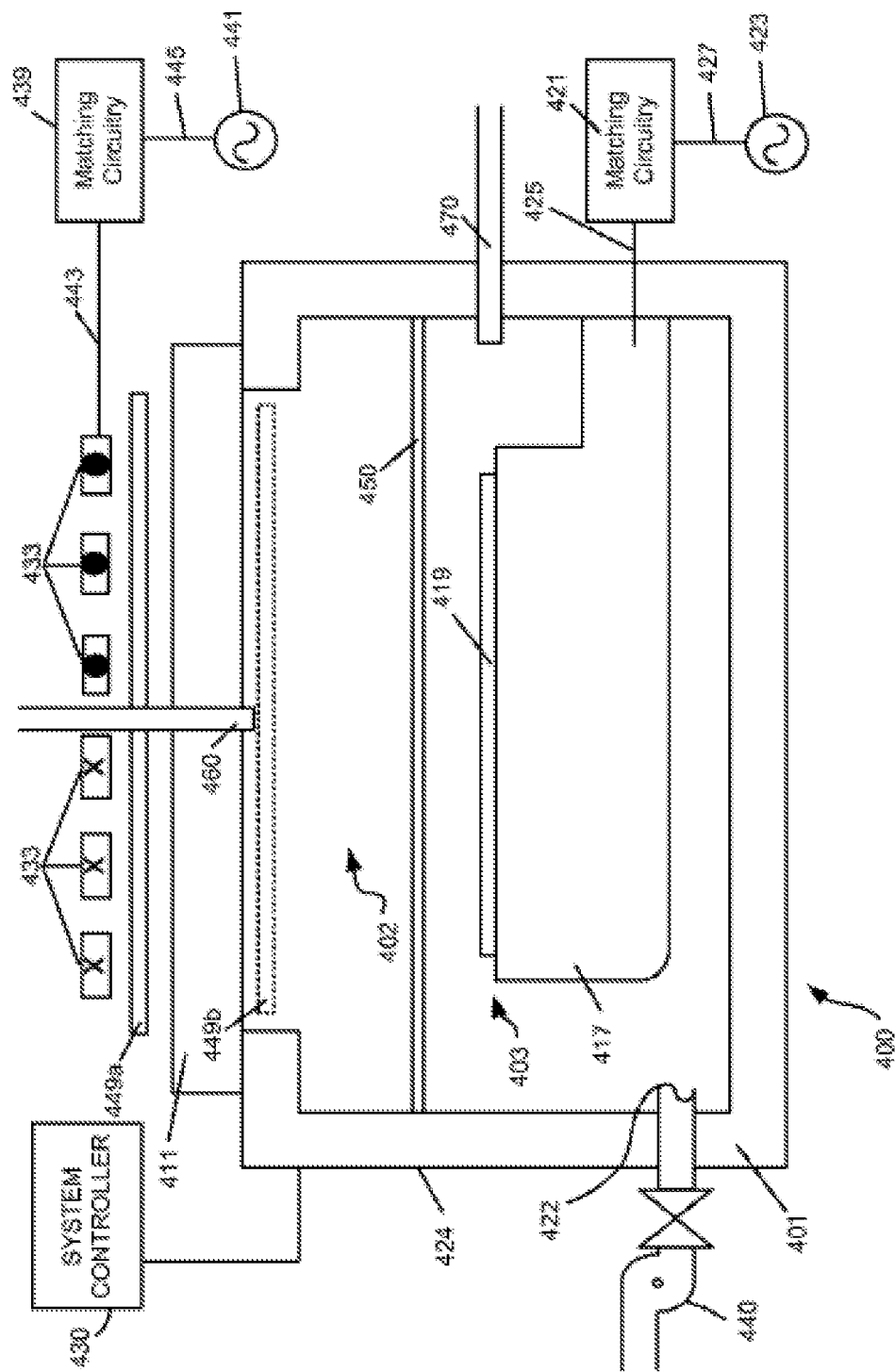
FIG. 5 is a schematic presentation of an apparatus that is suitable for etching $SnO_2$ using a hydrogen plasma etch chemistry according to an embodiment provided herein.

FIG. 5 schematically shows a cross-sectional view of an inductively coupled plasma integrated etching and deposition apparatus 400 appropriate for implementing hydrogen plasma etching described herein, an example of which is a Kiyo® reactor, produced by Lam Research Corp. of Fremont, Calif. The inductively coupled plasma apparatus 400 includes an overall process chamber 424 structurally defined by chamber walls 401 and a window 411. The chamber walls 401 may be fabricated from stainless steel or aluminum. The window 411 may be fabricated from quartz or other dielectric material. An optional internal plasma grid 450 divides the overall process chamber into an upper sub-chamber 402 and a lower sub-chamber 403. In most embodiments, plasma grid 450 may be removed, thereby utilizing a chamber space made of sub-chambers 402 and 403. A chuck 417 is positioned within the lower sub-chamber 403 near the bottom inner surface. The chuck 417 is configured to receive and hold a semiconductor wafer 419 upon which the etching and deposition processes are performed. The chuck 417 can be an electrostatic chuck for supporting the wafer 419 when present. In some embodiments, an edge ring (not shown) surrounds chuck 417, and has an upper surface that is approximately planar with a top surface of the wafer 419, when present over chuck 417. The chuck 417 also includes electrostatic electrodes for chucking and dechucking the wafer 419. A filter and DC clamp power supply (not shown) may be provided for this purpose. Other control systems for lifting the wafer 419 off the chuck 417 can also be provided. The chuck 417 can be electrically charged using an RF power supply 423.

The RF power supply 423 is connected to matching circuitry 421 through a connection 427. The matching circuitry 421 is connected to the chuck 417 through a connection 425. In this manner, the RF power supply 423 is connected to the chuck 417. In various embodiments, a bias power of the electrostatic chuck may be set at about 50 Vb or may be set at a different bias power depending on the process performed in accordance with disclosed embodiments. For example, the bias power may be between about 20 Vb and about 100 Vb, or between about 30 Vb and about 150 Vb.

Elements for plasma generation include a coil 433 is positioned above window 411. In some embodiments, a coil is not used in disclosed embodiments. The coil 433 is fabricated from an electrically conductive material and includes at least one complete turn. The example of a coil 433 shown in FIG. 5 includes three turns. The cross-sections of coil 433 are shown with symbols, and coils having an "X" extend rotationally into the page, while coils having a "•" extend rotationally out of the page. Elements for plasma generation also include an RF power supply 441 configured to supply RF power to the coil 433. In general, the RF power supply 441 is connected to matching circuitry 439 through a connection 445. The matching circuitry 439 is connected to the coil 433 through a connection 443. In this manner, the RF power supply 441 is connected to the coil 433. An optional Faraday shield 449a is positioned between the coil 433 and the window 411. The Faraday shield 449a may be maintained in a spaced apart relationship relative to the coil 433. In some embodiments, the Faraday shield 449a is disposed immediately above the window 411. In some embodiments, the Faraday shield 449b is between the window 411 and the chuck 417. In some embodiments, the Faraday shield 449b is not maintained in a spaced apart relationship relative to the coil 433. For example, the Faraday shield 449b may be directly below the window 411 without a gap. The coil 433, the Faraday shield 449a, and the window 411 are each configured to be substantially parallel to one another. The Faraday shield 449a may prevent metal or other species from depositing on the window 411 of the process chamber 424.

Process gas (e.g. $H_2$ and He, etc.) may be flowed into the process chamber through one or more main gas flow inlets 460 positioned in the upper sub-chamber 402 and/or through one or more side gas flow inlets 470. Likewise, though not explicitly shown, similar gas flow inlets may be used to supply process gases to a capacitively coupled plasma processing chamber. A vacuum pump, e.g., a one or two stage mechanical dry pump and/or turbomolecular pump 440, may be used to draw process gases out of the process chamber 424 and to maintain a pressure within the process chamber 424. For example, the vacuum pump may be used to evacuate the lower sub-chamber 403 during a purge operation of. A valve-controlled conduit may be used to fluidically connect the vacuum pump to the process chamber 424 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 400, one or more process gases such as an Hz-containing gas, may be supplied through the gas flow inlets 460 and/or 470. In certain embodiments, process gas may be supplied only through the main gas flow inlet 460, or only through the side gas flow inlet 470. In some cases, the gas flow inlets shown in the figure may be replaced by more complex gas flow inlets, one or more showerheads, for example. The Faraday shield 449a and/or optional grid 450 may include internal channels and holes that allow delivery of process gases to the process chamber 424. Either or both of Faraday shield 449a and optional grid 450 may serve as a showerhead for delivery of process gases. In some embodiments, a liquid vaporization and delivery system may be situated upstream of the process chamber 424, such that once a liquid reactant or precursor is vaporized, the vaporized reactant or precursor is introduced into the process chamber 424 via a gas flow inlet 460 and/or 470.

Radio frequency power is supplied from the RF power supply 441 to the coil 433 to cause an RF current to flow through the coil 433. The RF current flowing through the coil 433 generates an electromagnetic field about the coil 433. The electromagnetic field generates an inductive current within the upper sub-chamber 402. The physical and chemical interactions of various generated ions and radicals with the wafer 419 etch features of and selectively deposit layers on the wafer 419.

If the plasma grid 450 is used such that there is both an upper sub-chamber 402 and a lower sub-chamber 403, the inductive current acts on the gas present in the upper sub-chamber 402 to generate an electron-ion plasma in the upper sub-chamber 402. The optional internal plasma grid 450 limits the amount of hot electrons in the lower sub-chamber 403. In some embodiments, the apparatus 400 is designed and operated such that the plasma present in the lower sub-chamber 403 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 403 through port 422. For example, $SnH_4$ generated during etching of $SnO_2$ using $H_2$ plasma can be removed through port 422 during purging and/or evacuation. The chuck 417 disclosed herein may operate at elevated temperatures ranging between about 10° C. and about 250° C. The temperature will depend on the process operation and specific recipe. In some embodiments the apparatus is controlled to conduct the etching at a temperature of less than about 100° C.

Apparatus 400 may be coupled to facilities (not shown) when installed in a clean room or a fabrication facility. Facilities include plumbing that provide processing gases, vacuum, temperature control, and environmental particle control. These facilities are coupled to apparatus 400, when installed in the target fabrication facility. Additionally, apparatus 400 may be coupled to a transfer chamber that allows robotics to transfer semiconductor wafers into and out of apparatus 400 using typical automation.

In some embodiments, a system controller 430 (which may include one or more physical or logical controllers)

controls some or all of the operations of a process chamber 424. The system controller 430 may include one or more memory devices and one or more processors. In some embodiments, the apparatus 400 includes a switching system for controlling flow rates of the process gases. The controller, in some embodiments, includes program instructions for causing the steps of any of the methods provided herein.

In some implementations, the system controller 430 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 430, which may control various components or subparts of the system or systems. The system controller, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 430 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 430, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 430 receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller 430 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 6:
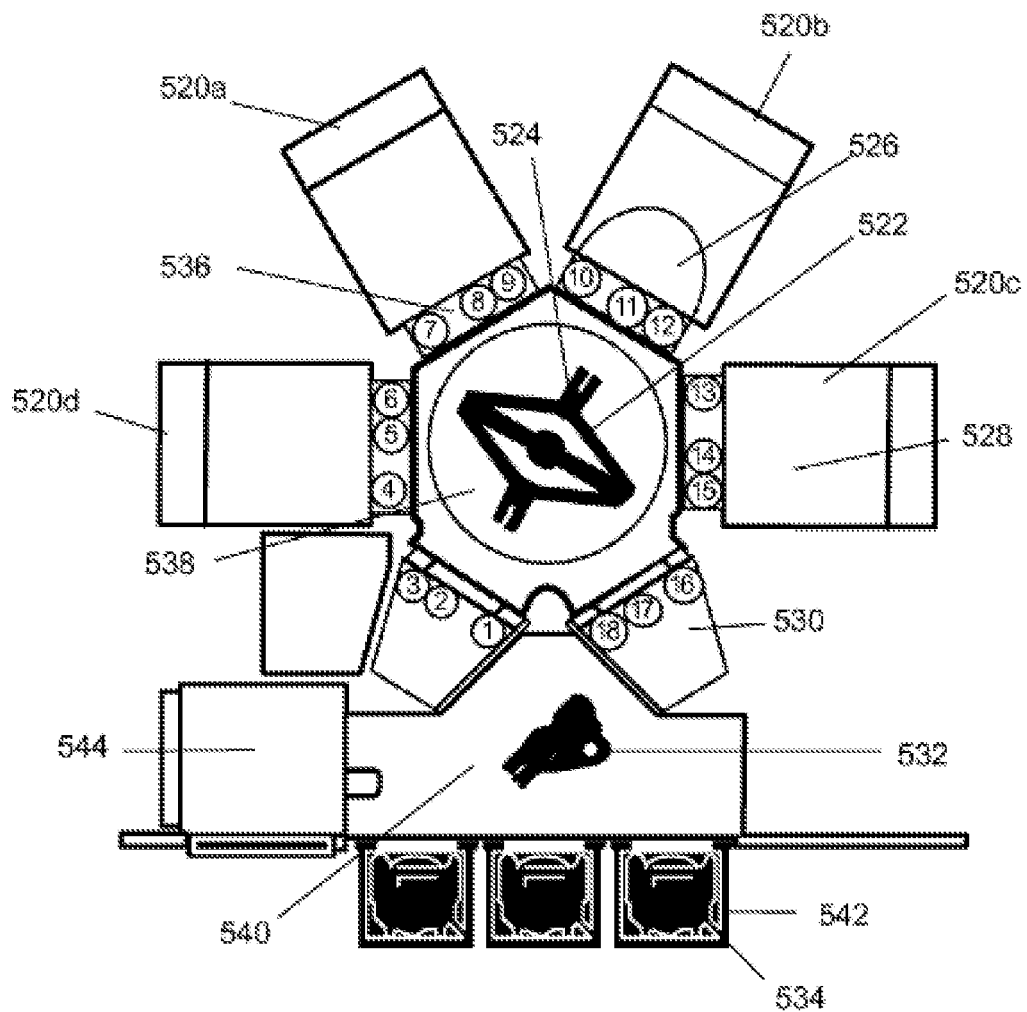
FIG. 6 shows a schematic view of a multi-station processing system according to an embodiment provided herein.

FIG. 6 depicts a semiconductor process cluster architecture with various modules that interface with a vacuum transfer module 538 (VTM). The arrangement of various modules to "transfer" wafers among multiple storage facilities and processing modules may be referred to as a "cluster tool architecture" system. Airlock 530, also known as a loadlock or transfer module, interfaces with the VTM 538 which, in turn, interfaces with four processing modules 520a-520d, which may be individual optimized to perform various fabrication processes. By way of example, processing modules 520a-520d may be implemented to perform substrate etching, deposition, ion implantation, wafer cleaning, sputtering, and/or other semiconductor processes. In some embodiments, $SnO_2$ deposition and $SnO_2$ etching are performed in the same module. In some embodiments, $SnO_2$ deposition and $SnO_2$ etching are performed in different modules of the same tool. One or more of the substrate etching processing modules (any of 520a-520d) may be implemented as disclosed herein, e.g., for depositing conformal films, selectively etching $SnO_2$, forming air gaps, and other suitable functions in accordance with the disclosed embodiments. Airlock 530 and processing modules 520a-520d may be referred to as "stations." Each station has a facet 536 that interfaces the station to VTM 538. Inside each facet, sensors 1-18 are used to detect the passing of wafer 526 when moved between respective stations.

Robot 522 transfers wafer 526 between stations. In one embodiment, robot 522 has one arm, and in another embodiment, robot 522 has two arms, where each arm has an end effector 524 to pick wafers such as wafer 526 for transport. Front-end robot 532, in atmospheric transfer module (ATM) 540, is used to transfer wafers 526 from cassette or Front Opening Unified Pod (FOUP) 534 in Load Port Module (LPM) 542 to airlock 530. Module center 528 inside processing modules 520a-520d is one location for placing wafer 526. Aligner 544 in ATM 540 is used to align wafers.

In an exemplary processing method, a wafer is placed in one of the FOUPs 534 in the LPM 542. Front-end robot 532 transfers the wafer from the FOUP 534 to an aligner 544, which allows the wafer 526 to be properly centered before it is etched or processed. After being aligned, the wafer 526 is moved by the front-end robot 532 into an airlock 530. Because the airlock 530 has the ability to match the environment between an ATM 540 and a VTM 538, the wafer 526 is able to move between the two pressure environments without being damaged. From the airlock 530, the wafer 526 is moved by robot 522 through VTM 538 and into one of the processing modules 520a-520d. In order to achieve this wafer movement, the robot 522 uses end effectors 524 on each of its arms. Once the wafer 526 has been processed, it is moved by robot 522 from the processing modules 520a-520d to the airlock 530. From here, the wafer 526 may be moved by the front-end robot 532 to one of the FOUPs 534 or to the aligner 544.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 5 may be implemented with the tool in FIG. 6. Machine-readable media containing instructions for controlling process operations in accordance with the present invention may be coupled to the system controller.

In some embodiments an apparatus is provided, where the apparatus includes a process chamber having a substrate holder configured for holding the semiconductor substrate during etching; a plasma generator configured for generating a plasma in a process gas; and a controller. The controller includes program instructions for implementing any of the methods describing herein. In one embodiment, the controller includes program instructions for causing the etching of the $SnO_2$ layer on the semiconductor substrate at a temperature of less than about 100° C., wherein causing the etching comprises causing an exposure of the semiconductor substrate to a plasma formed in a process gas comprising at least about 50% $H_2$.

In another aspect a non-transitory computer machine-readable medium is provided, where it includes code for causing the etching of the $SnO_2$ layer on the semiconductor substrate at a temperature of less than about 100° C., wherein causing the etching comprises causing an exposure of the semiconductor substrate to a plasma formed in a process gas comprising at least about 50% $H_2$.

In another aspect, a system for forming an air gap on a semiconductor substrate is provided. The system includes one or more deposition chambers; one or more etch chambers; and a controller. The controller includes program instructions for implementing any air gap formation methods described herein. For example, the controller may include instructions for causing the steps of (i) on a semiconductor substrate having an exposed layer of a first material, an exposed layer of a second material, and an exposed layer of $SnO_2$ positioned between the layer of the first material and the layer of the second material, selectively etching the exposed $SnO_2$ relative to both the first and the second materials using a hydrogen plasma etch chemistry, and thereby forming a recessed feature between the first and second materials; and (ii) depositing a third material over the recessed feature without fully filling the recessed feature, and thereby forming the air gap between the layer of the first material and the layer of the second material.

In another aspect, the system includes any of the apparatuses and systems described herein and a stepper.

In another aspect a non-transitory computer machine-readable medium is provided, where it includes code for: (i) on a semiconductor substrate having an exposed layer of a first material, an exposed layer of a second material, and an exposed layer of $SnO_2$ positioned between the layer of the first material and the layer of the second material, selectively etching the exposed $SnO_2$ relative to both the first and the second materials using a hydrogen plasma etch chemistry, and thereby forming a recessed feature between the first and second materials; and (ii) depositing a third material over the recessed feature without fully filling the recessed feature, and thereby forming the air gap between the layer of the first material and the layer of the second material.

FURTHER IMPLEMENTATIONS

The apparatus and processes described herein may be used in conjunction with lithographic patterning tools or processes, for example, for the fabrication or manufacture of semiconductor devices, displays, LEDs, photovoltaic panels, and the like. Typically, though not necessarily, such apparatus and processes will be used or conducted together in a common fabrication facility. Lithographic patterning of a film typically comprises some or all of the following steps, each step enabled with a number of possible tools: (1) application of photoresist on a work piece, i.e., a substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or work piece by using a dry or plasma-assisted etching tool; and (6) removing the resist using a tool such as an RF or microwave plasma resist stripper.

What is claimed is:

1. A method of processing a semiconductor substrate, the method comprising:
    (a) sequentially exposing the semiconductor substrate to a tin-containing precursor and an oxygen-containing precursor to deposit SnO2 and form a semiconductor substrate having an exposed SnO2 layer;
    (b) etching the SnO2 layer at a temperature of less than about 100° C., wherein the etching comprises exposing the semiconductor substrate to a plasma formed in a process gas comprising at least about 50% $H_2$ to form a volatile tin hydride, wherein the etching is conducted without formation of solid products on the semiconductor substrate.

2. The method of claim 1, wherein the tin-containing precursor has a general formula $R_x$–Sn–$A_{4-x}$, wherein R is selected from the group consisting of hydrogen, alkyl, alkenyl, and alkynyl, and A=YR'z, wherein Y is N, R' is selected from the group consisting of alkyl, alkenyl, and alkynyl, x is 0, 1, 2, or 3, and z is 2.

3. The method of claim 2, wherein each R' in A=YR'$_z$ is same.

4. The method of claim 3, wherein the tin-containing precursor is tetrakis(dimethylamino)tin.

5. The method of claim 2, wherein each R' in A=YR'$_z$ is different.

6. The method of claim 5, wherein the tin-containing precursor is tetrakis(ethylmethylamino)tin.

7. The method of claim 2, wherein the tin-containing precursor is selected from the group consisting of N$^2$, N$^3$-di-tert-butyl-butane-2,3-diamino-tin(II), and 1,3-bis(1,2methylethyl)-4,5-dimethyl-(4R, 5R)-1,3,2-diazastannolidin-2-ylidine.

8. The method of claim 1, wherein the tin-containing precursor is an alkyl substituted tin amide.

9. The method of claim 1, wherein the oxygen-containing precursor is selected from the group consisting of oxygen, ozone, water, hydrogen peroxide, and NO.

10. The method of claim 1, wherein depositing the SnO$_2$ layer comprises purging a process chamber between exposure of the semiconductor substrate to the tin-containing precursor and exposure of the substrate to the oxygen-containing precursor with an inert gas.

11. The method of claim 1, wherein the deposition of SnO2 layer is performed at a process parameter that maintains each of the tin-containing precursor and the oxygen-containing precursor independently in a gaseous phase.

12. The method of claim 11, wherein the process parameter is a temperature of the process chamber that is between about 20° C. and about 500° C.

13. The method of claim 11, wherein the process parameter is a flow rate at which each of the tin-containing precursor and the oxygen-containing precursor independently is flowed between about 10 sccm and about 10,000 sccm.

14. The method of claim 1, wherein each of the tin-containing precursor and the oxygen-containing precursor is independently combined with a carrier gas, the carrier gas being selected from the group consisting of helium, argon, and nitrogen.

15. The method of claim 1, wherein the deposition of SnO$_2$ layer is performed using at least one of processes selected from the group consisting of atomic layer deposition, and plasma enhanced atomic layer deposition.

16. The method of claim 1, wherein the tin-containing precursor is selected from the group consisting of tetrakis(dimethylamino)tin and tetrakis(ethylmethylamino)tin.

* * * * *